US010991564B2

(12) United States Patent
Cooks et al.

(10) Patent No.: US 10,991,564 B2
(45) Date of Patent: *Apr. 27, 2021

(54) MASS SPECTROMETRY PROBES AND SYSTEMS FOR IONIZING A SAMPLE

(71) Applicant: Purdue Research Foundation, West Lafayette, IN (US)

(72) Inventors: Robert Graham Cooks, West Lafayette, IN (US); Depanjan Sarkar, Chennai (IN); Thalappil Pradeep, Madras (IN); Rahul Narayanan, Chennai (IN)

(73) Assignee: Purdue Research Foundation, West Lafayette, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/732,568

(22) Filed: Jan. 2, 2020

(65) Prior Publication Data

US 2020/0168446 A1 May 28, 2020

Related U.S. Application Data

(63) Continuation of application No. 16/516,823, filed on Jul. 19, 2019, now Pat. No. 10,559,455, which is a (Continued)

(30) Foreign Application Priority Data

Dec. 30, 2013 (IN) .............. 6137/CHE/2013

(51) Int. Cl.
*H01J 49/16* (2006.01)
*H01J 49/04* (2006.01)
(Continued)

(52) U.S. Cl.
CPC ........ *H01J 49/165* (2013.01); *H01J 49/0409* (2013.01); *H01J 49/0431* (2013.01);
(Continued)

(58) Field of Classification Search
CPC .. H01J 49/165; H01J 49/0409; H01J 49/0431; H01J 49/16; H01J 49/0013
See application file for complete search history.

(56) References Cited

U.S. PATENT DOCUMENTS

| 4,663,230 A | 5/1987 | Tennent | |
|---|---|---|---|
| 6,452,167 B1 * | 9/2002 | Felter | H01J 1/3042 |
| | | | 250/292 |

(Continued)

FOREIGN PATENT DOCUMENTS

| CN | 102324375 | 1/2012 |
|---|---|---|
| CN | 102522311 A | 6/2012 |

(Continued)

OTHER PUBLICATIONS

Bethune, 1993, Cobalt-catalysed growth of carbon nanotubes with single-atomic-layer walls, Nature, 363:605-607.
(Continued)

*Primary Examiner* — Sean M Luck
(74) *Attorney, Agent, or Firm* — Brown Rudnick LLP; Adam M. Schoen

(57) ABSTRACT

The invention generally relates to mass spectrometry probes and systems for ionizing a sample. In certain embodiments, the invention provides a mass spectrometry probe including a substrate in which a portion of the substrate is coated with a material, a portion of which protrudes from the substrate.

20 Claims, 26 Drawing Sheets

Related U.S. Application Data continuation of application No. 15/104,405, filed as application No. PCT/US2014/071856 on Dec. 22, 2014, now Pat. No. 10,395,913.

(60) Provisional application No. 61/926,713, filed on Jan. 13, 2014.

(51) Int. Cl.
*H05K 1/18* (2006.01)
*H01J 49/00* (2006.01)

(52) U.S. Cl.
CPC .............. *H01J 49/16* (2013.01); *H05K 1/18* (2013.01); *H01J 49/0013* (2013.01)

(56) References Cited

U.S. PATENT DOCUMENTS

| | | | |
|---|---|---|---|
| 6,803,568 B2 | 10/2004 | Bousse et al. | |
| 6,885,010 B1* | 4/2005 | Traynor ................. | B82Y 10/00 250/423 R |
| 6,891,156 B2 | 5/2005 | DiCesare | |
| 6,958,475 B1 | 10/2005 | Colby | |
| 7,408,147 B2* | 8/2008 | Blick ..................... | B82Y 15/00 250/251 |
| 8,304,718 B2 | 11/2012 | Ouyang et al. | |
| 8,859,956 B2 | 10/2014 | Ouyang et al. | |
| 2002/0060290 A1 | 5/2002 | Pham | |
| 2005/0098720 A1 | 5/2005 | Traynor et al. | |
| 2006/0159916 A1 | 7/2006 | Dubrow et al. | |
| 2006/0289782 A1* | 12/2006 | Fischer ................. | H01J 49/165 250/423 F |
| 2007/0272852 A1* | 11/2007 | Miller ................... | H01J 49/025 250/288 |
| 2009/0166523 A1 | 7/2009 | Bachmann et al. | |
| 2009/0283693 A1 | 11/2009 | Hsu et al. | |
| 2010/0316792 A1* | 12/2010 | Lee ........................ | H01J 29/04 427/77 |
| 2011/0015423 A1* | 1/2011 | Habeeb ................. | B82Y 40/00 560/8 |
| 2011/0192968 A1 | 8/2011 | Makarov et al. | |
| 2011/0223085 A1* | 9/2011 | Kelkar .................... | F23J 15/04 423/228 |
| 2012/0119079 A1* | 5/2012 | Ouyang .............. | H01J 49/0431 250/282 |
| 2012/0160997 A1* | 6/2012 | Fink ....................... | H01J 49/10 250/282 |
| 2012/0326022 A1* | 12/2012 | Kumano ............ | H01J 49/0409 250/282 |
| 2013/0112017 A1 | 5/2013 | Ouyang et al. | |
| 2013/0344610 A1* | 12/2013 | Cooks ................... | H01J 49/06 436/141 |

FOREIGN PATENT DOCUMENTS

| | | |
|---|---|---|
| JP | 2005-190767 A | 7/2005 |
| JP | 2012-525687 A | 10/2012 |
| WO | 2008/103733 A2 | 8/2008 |
| WO | 2012/167126 A1 | 12/2012 |
| WO | 2012/170301 A1 | 12/2012 |
| WO | 2014/120552 A1 | 8/2014 |

OTHER PUBLICATIONS

Bhalerao, 2012, Optical redshift in the Raman scattering spectra of Fe-doped Multiwalled carbon nanotubves: Experiment and theory, Physical Review B86:125419.
Buhrman, 1996, Quantitation of SR 27417 in Human Plasma Using Electrospray Liquid Chromatography-Tandem Mass Spectrometry: A Study of Ion Supression, J. Am. Mass Spectrom. 7:1099-1105.
Cech 2001, Practical implications of some recent studies in electrospray ionization fundamentals, Mass Spectrom Rev, 20:362-387.
Chisvert, 2013, Cosmetic ingredients: from the cosmetic to the human body and the environment, Anal Methods, 5:309.
Cody, 2005, Versatile New Ion Source for the Analysis of Materials in Open Air under Ambient Conditions, Anal. Chem., 77, 2297-2302.
Costa, 2008, Characterization of carbon nanotubes by Raman spectroscopy, Mater. Sci.-Pol, 26(2):433-441.
EP Application No. 14875647.1 Office action dated Dec. 7, 2018, 5 pages.
Extended Search Report completed Jun. 17, 2017 for EP Application No. 14875647.1.
Fico, 2007, Miniaturization and Geometry Optimization of a Polymer-Based Rectilinear Ion Trap, Anal. Chem, 79:8076-8082.
First Office Action dated Jun. 6, 2017 in CN01480076440.3.
Gao, 2006, Handheld Rectilinear Ion Trap Mass Spectrometer, Anal. Chem, 78:5994-6002.
Gao, 2008, Design and Characterization of a Multisource Hand-Held Tandem Mass Spectrometer, Anal. Chem. 80:7198-7205.
Ginger, 2004, The Evolution f Dip-Pen Nanolithography, Angew. Chem. Int. Ed. 43:30-45.
Goodsell, 2010, Field Ionization of Cold Atoms near the Wall of a Single Carbon Nanotube, Physical Review Letters, 2010, 1-12.
Gruener, 2009, Integrated atom detector based on field ionization near carbon nanotubes, Phys. Rev. A: At., Mol., Opt. Phys, 80: 063422-063422-7.
Haapala, 2007, Desorption Atmospheric Pressure Photoionization, Anal. Chem., 79:7867-7872.
Harris, 2011, Ambient sampling/ionization mass spectrometry: applications and current trends, Analytical Chemistry 83:4508-4538.
Hopfgartner, 2003, Quantitative Hig-Throughput Analysis of Drugs in Biological Matrices by Mass Spectrometry, Mass Spectrom. Reviews, 22:195-214.
Hou, 2011, Sampling Wand for an Ion Trap Mass Spectrometer, Anal. Chem, 83:1857-1861.
Iijima, 1991, Helical microtubules of graphitic carbon, Nature, 354:56-58.
Iijima, 1993, Single-shell carbon nanotubes of 1-nm diameter, Nature, 363:603-605.
International Preliminary Report on Patentability for International Patent Application No. PCT/US14/71856, dated Jul. 6, 2016.
International Search Report and Written Opinion dated Mar. 26, 2015, for International Patent Application No. PCT/US14/71856, filed Dec. 22, 2014 (7 pages).
JP Application No. 2016-543047 Office action dated Apr. 19, 2019 with English translation, 5 pages.
Kouvetakis, 1994, Novel Synthetic Routes to Carbon-Nitrogen Thin Films, Chem. Mater., 6:811-814.
Kratschmer, 1990, Solid C60: a new form of carbon, Nature, 347:354-358.
Kroto, 1985, C60:Buckminsterfullerene, Nature, 318:-162-163.
Lee, 2011, Effect of plasma treatment on electrical conductivity and Raman spectra of carbon nanotubes,J. Phys. Chem. Solids, 72:1101-1103.
Liu, et al., "Development, Characterization, and Application of Paper Spray Ionization," Anal. Chem. 2010, 82, 2463-2471.
Loo, 2002, Additive, nanoscale pattering of metal films with a stamp and a surface chemistry mediated transfer process: Applications in a plastic electronics, Applied Physics, 81(3):562-564.
Luo,2011, Field ionization using densely spaced arrays of nickel-tipped carbon nanotubes, Chemical Physics Letters, 505:126-129.
Matuszewski, 1998, Matrix Effect in Quantitative LC/MS/MS Analyses of Biological Fluids: A Method for Determination of Finasteride in Human Plasma at Picogram Per Milliliter Concentrations, Anal. Chem., 70:882-889.
Mintmire, 1992, Are Fullerene Tubules Metallic? Physical Review Letters, 68:631-634.
Monge, 2013, Mass Spectrometry: Recent Advances in Direct Open Air Surface Sampling/Ionization, Chemical Reviews, 113:2269-2308.
Monthioux, 2006, Who should be given the credit for the discovery of carbon nanotubes, Carbon, 44:1621-1623.

(56) References Cited

OTHER PUBLICATIONS

Moshammer, 2009, Selective suspension in aqueous sodium dodecyl sulfate according to electronic structure type allows simple separation of metallic from semiconducting single-walled carbon nanotubes, Nano Res., 2:8, 599-606.

Mulligan, 2006, Desorption electrospray ionization with a portable mass spectrometer: in situ analysis of ambient surfaces, Chem, Commun. 1709-1711.

Mustard, 1989, Isolation of Human Platelets from Plasma by Centrifugation and Washing, Methods in Enzymology, 169:3-11.

Naeemi, 2009, Carbon Nanotube Interconnects, Annu. Rev. Mater. Res, 39:255-275.

Narayanan, et al., "Molecular Ionization from Carbon Nanotube Paper", Angewandte Chemie International Edition, vol. 1. 53, No. 23, Mar. 18, 2014.

Oberlin, 1976, Filamentous Growth of Carbon Through Benzene Decomposition, J. Crystal Growth, 32:335-349.

Oku, 2000, Microstructure analysis of CN-base nanocage materials by high-resolution electron microscopy, Diamond and Related Materials, 9:906-910.

Ouyang, 2009, Handeld Miniature Ion Trap Mass Spectrometer, Anal. Chem. 81:2421-2425.

Ouyang, 2009, Miniature Mass Spectrometry, Ann. Rev. Anal. Chem, 2:187-214.

Sanders, 2010, Hand-held mass spectrometer for environmentally relevant analytes using a variety of sampling and Ionization methods, Eur. J. Mass Spectrom., 16:11-20.

Scheibe, 2010, Oxidation and reduction of multiwalled carbon nanotubes—preparation and characterization, Mater. Charact. 61:185-191.

Shamsipur, 2012, A Novel Hydrogen Peroxide Sensor Based on the Direct Electron Transfer of Catalase Immobilized on Nano-Sized NiO/MWCNTs Composite Film, Electroanalysis, 24(2):357-367.

Smith, 1998, Encapsulated C60 in Carbon Nanotubes, Nature, 396:323-324.

Smith, 2000, Formation mechanism of fullerene peapods and coaxial tubes: a path to large scale synthesis, Chemical Physica Letters, 321:169-174.

Sokol, 2011, Miniature mass spectrometer equipped with electrospray and desorption electrospray ionization for direct analysis of organics from solids and solutions, International J Mass Spectrom., 306:187-195.

Stoner, 2011, Graphenated carbon nanotubes for enhance electrochemical double layer capacitor performance, Applied Physics Letters, 99:183104-1.

Takats, 2004, Mass Spectrometry Sampling Under Ambient Conditions with Desorption Electrospray Ionization, Science, 306, 471-473.

Takats, 2005, Direct, trace level detection of explosives on ambient surfaces by desorption electrospray ionization mass spectrometry, Chem. Commun., 1950-1952.

Wang, 2000, Charged residue versus ion evaporation for formation of alkali metal halide cluster ions in ESI, Anal. Chem. Acta, 406:53-65.

Xu, 1996, On-line probe for fast electrochemistry/electrospray mass spectrometry. Investigation of polycyclic aromatic hydrocarbons, Anal. Chem., 68, 4244-4253.

Xu. 2010, Miniaturization of Mass Spectrometry Analysis Systems, JALA harlottesv Va, 15(6):433-439.

Yin, 2003, Unique Single-Crystalline Beta Carbon Nitride Nanorods, Adv. Mater., 15(21): 1840-1844.

Yu, 2011, Carbon Nanotube with Chemically Bonded Graphene Leaves for Electronic and Optoelectronic Applications, J. Phys, Chem. Lett., 2:1556-1562.

Zhang, 2013, Extractive electrospray ionization mass spectrometry for direct characterization of cosmetic products, Anal. Methods, 5:311-315.

Zhong, 2010, Synthesis of high nitrogen doping of carbon nanotubes and modeling the stabilization of filled DAATO@CNTS (10,10) for nanoenergetic materials, J. Physics and Chemistry Solids, 71:134-139.

* cited by examiner

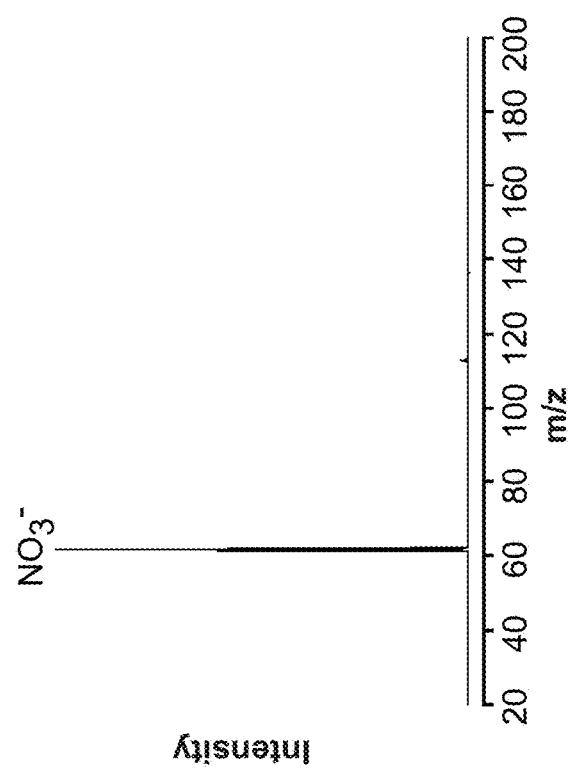
FIG. 8A
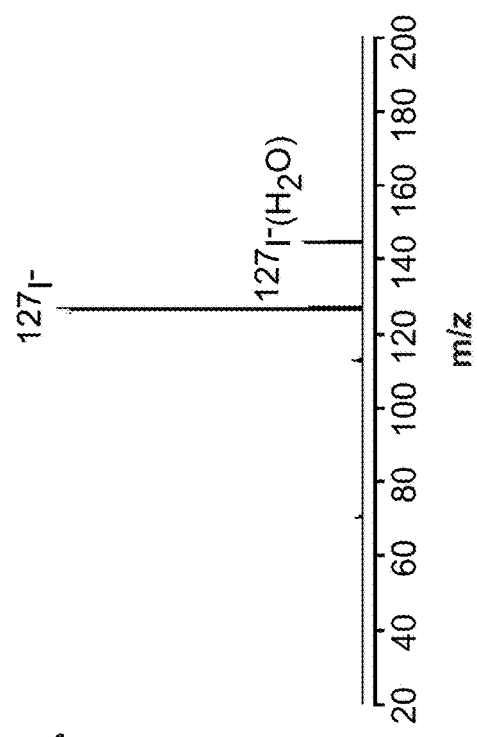
FIG. 8B
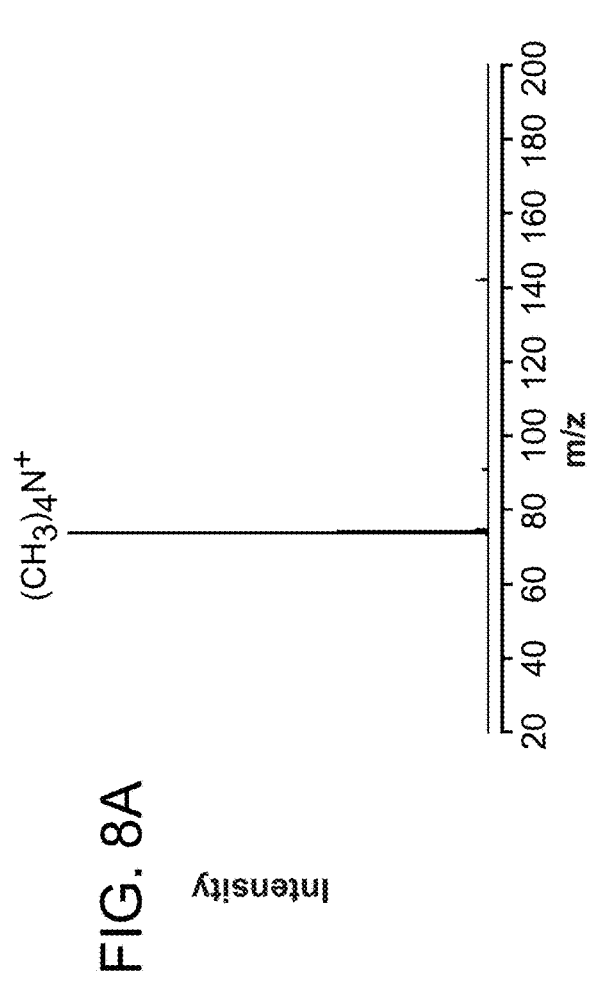
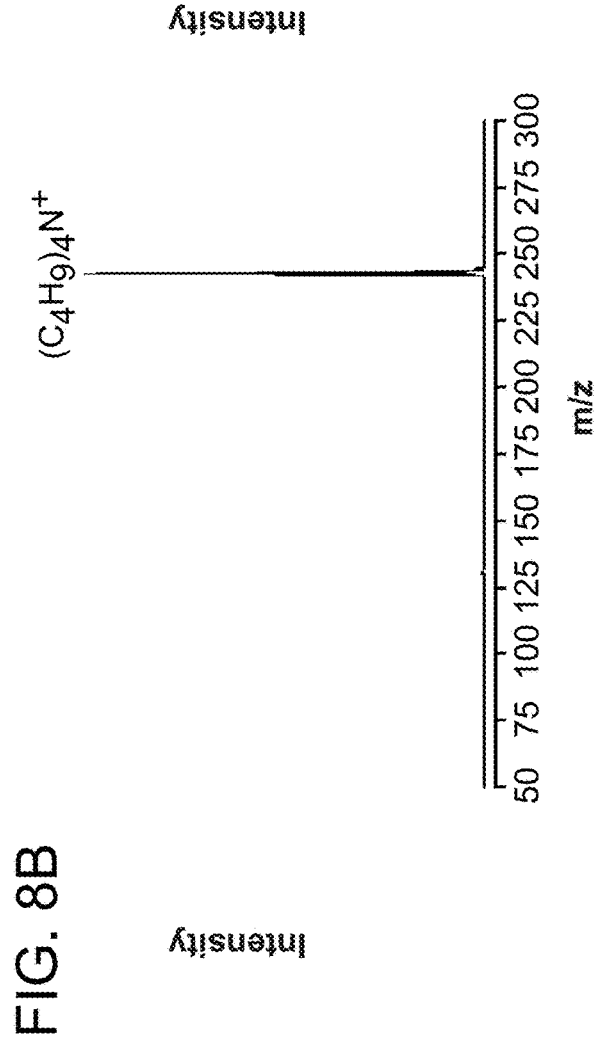

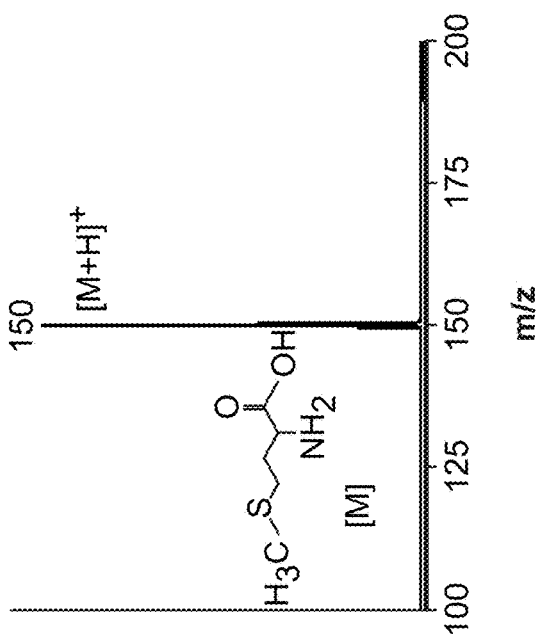
FIG. 12A
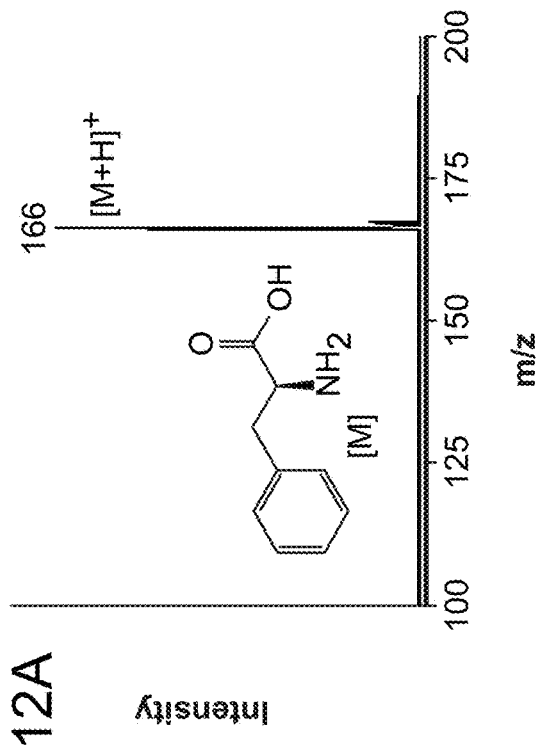
FIG. 12B
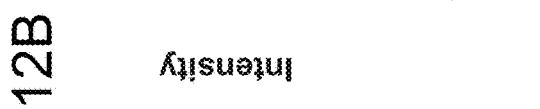
FIG. 12C
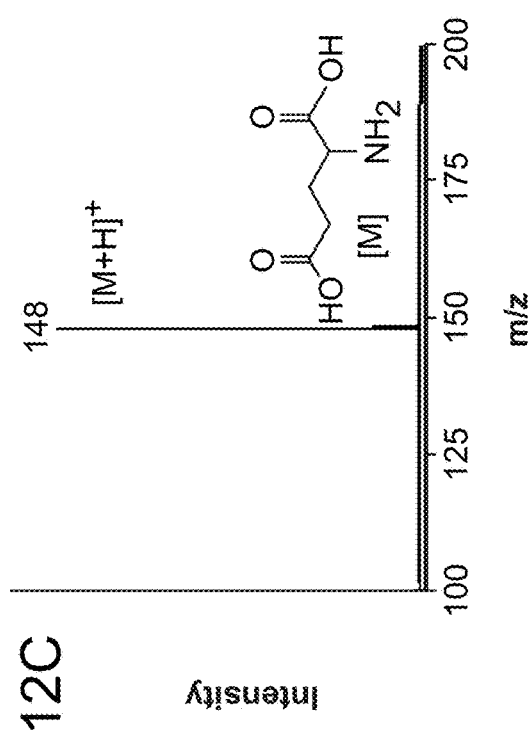
FIG. 12D
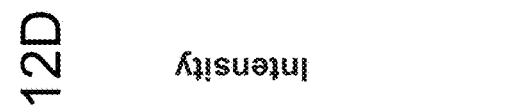

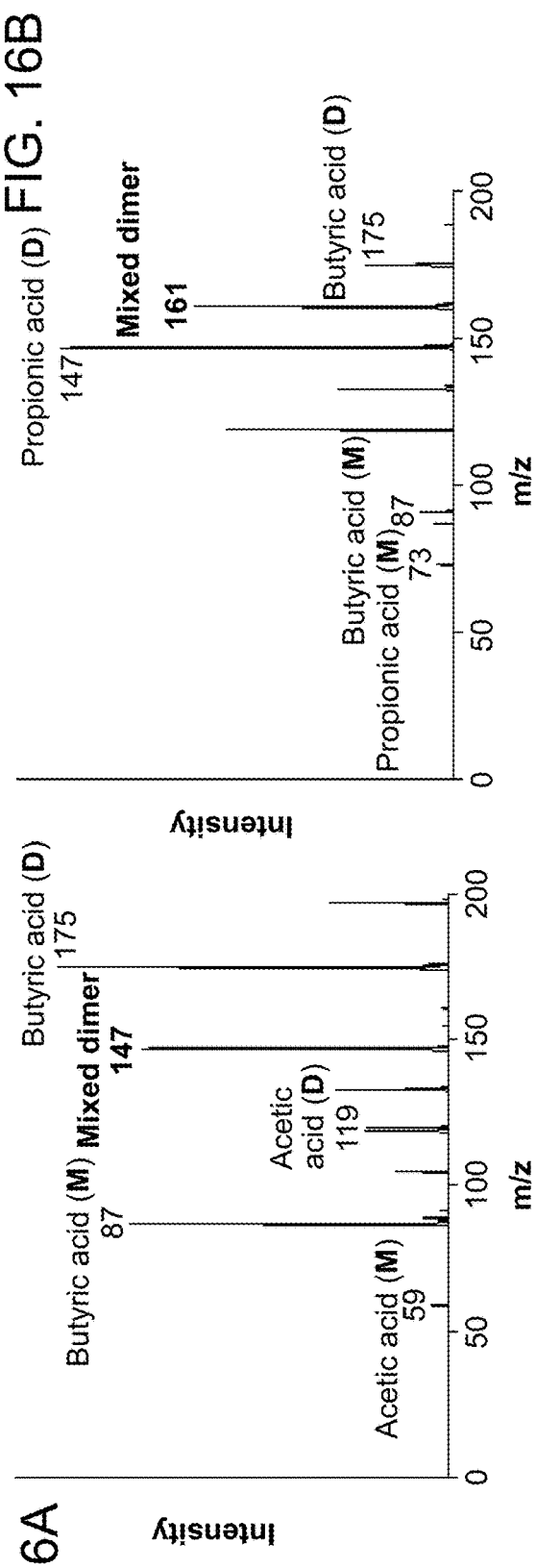
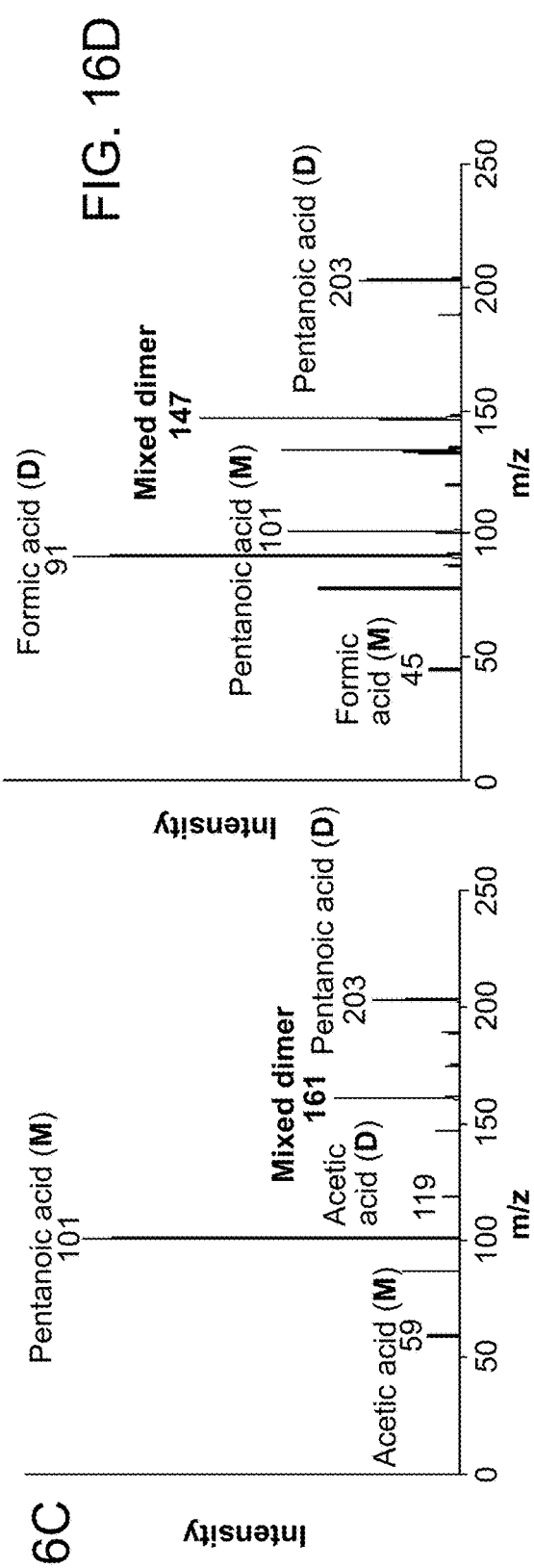

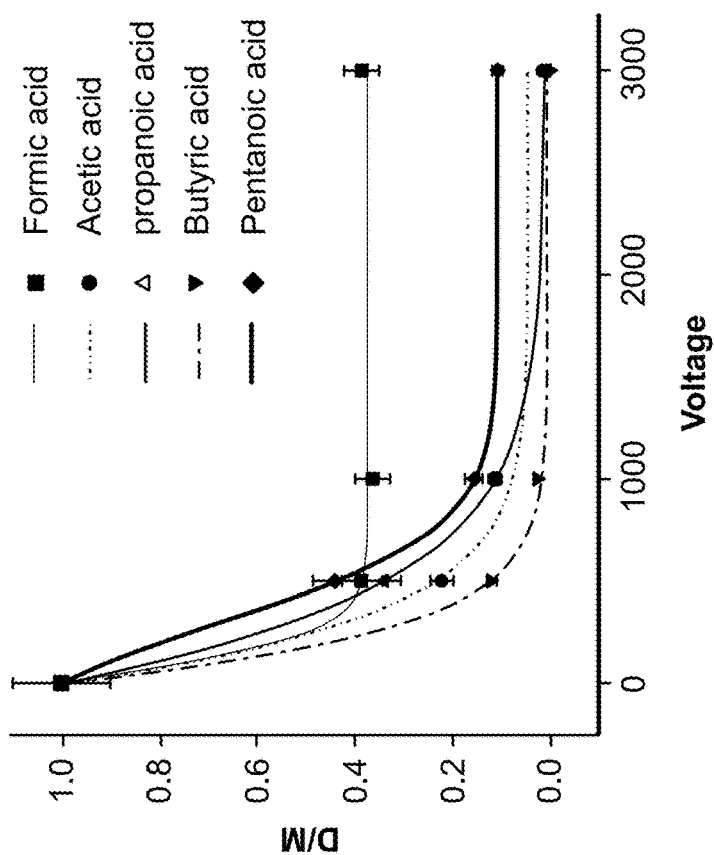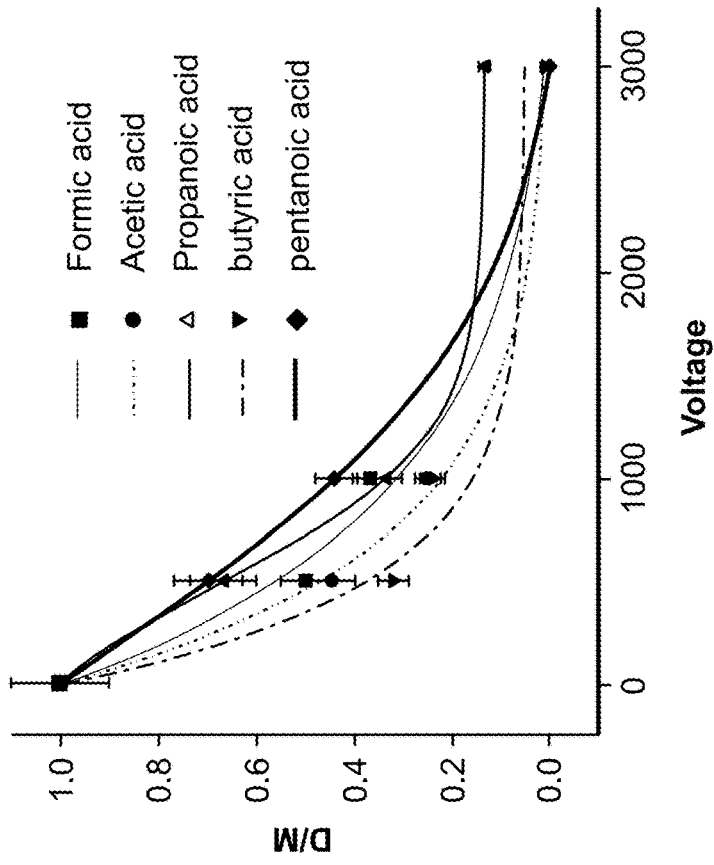
FIG. 17A
FIG. 17B

MASS SPECTROMETRY PROBES AND SYSTEMS FOR IONIZING A SAMPLE

RELATED APPLICATIONS

The present application is a continuation of U.S. nonprovisional application Ser. No. 16/516,823, filed Jul. 19, 2019, which is a continuation of U.S. nonprovisional application Ser. No. 15/104,405, filed Jun. 14, 2016, which is a 35 U.S.C. § 371 national phase application of PCT/US14/71856, filed Dec. 22, 2014, which claims the benefit of and priority to each of U.S. provisional patent application Ser. No. 61/926,713, filed Jan. 13, 2014, and Indian patent application number 6137/CHE/2013, filed Dec. 30, 2013, the content of each of which is incorporated by reference herein in its entirety.

GOVERNMENT SUPPORT

This invention was made with government support under CHE1307264 awarded by the National Science Foundation. The government has certain rights in the invention.

FIELD OF THE INVENTION

The invention generally relates to mass spectrometry probes and systems for ionizing a sample.

BACKGROUND

Recent progress in mass spectrometry has depended heavily on advances in methods of ion formation. Creation of stable molecular ions of complex molecules with minimum internal energy has been a primary goal of such experiments. The most widely used methods to achieve this are electrospray ionization (ESI) and matrix-assisted laser desorption ionization (MALDI). The newer ambient ionization methods, such as desorption electrospray ionization (DESI), allow samples to be examined in their native state with minimal or no sample pre-treatment. These advantages and the resulting speed of analysis have led to the introduction of some fifty different variants of ambient ionization. Direct analysis in real time (DART), extractive electrospray ionization (EESI), desorption atmospheric pressure chemical ionization (DAPCI), desorption atmospheric pressure photoionization (DAPPI), laser ablation electrospray ionization (LAESI), and paper spray ionization, are some of the new methods introduced over the past decade.

Many of those methods use a high voltage source coupled to the probe to achieve ionization in an ambient environment. The application of high voltage can sometimes cause unwanted fragmentation of a target analyte during the ionization process.

SUMMARY

The invention provides a low voltage mass spectrometry probe configured to generated ions without the need for a high voltage source. Aspects of the invention are accomplished with a substrate in which a portion of the substrate is coated with a material, a portion of which protrudes from the substrate. Generally, these protrusions are on the nanoscale and, without being limited by any particular theory or mechanism of action, act as an electrode. The protrusions provide a field strength high enough to cause field emission of microscale solution droplets containing analyte at these nanoscale protrusions. In that manner, mass spectrometry probes of the invention are able to ionize a target analyte through the application of a low voltage (e.g., 3 volts or less), rather than a high voltage, allowing for ionization without unwanted fragmentation of the target analyte.

In certain aspects, the invention provides a mass spectrometry probe including a substrate. The substrate can be porous or nonporous. An exemplary substrate is a paper substrate, such as a substrate composed of filter paper. The substrate can have any shape. In certain embodiments, the substrate tapers to a tip, such as a substrate including a planar portion that tapers to a tip. An exemplary shape is a triangular substrate that tapers to a tip.

The probe further includes a material that coats a portion of the substrate. A portion of that material protrudes from the substrate. In certain embodiments, the material is an electrically conductive material, although that is not required, because a solvent surrounding the material can be an electrolyte in some cases. Any electrically conductive material may be used with probes of the invention. An exemplary material includes electrically conductive nanotubes, such as carbon nanotubes. Typically, the carbon nanotubes coat an external surface of the substrate, and a distal portion of a plurality of the carbon nanotubes protrude from the surface of the substrate. It is also possible for portions of the carbon nanotubes, or any chosen material, to impregnate the substrate.

In certain embodiments, the substrate is coupled to a voltage source. In certain embodiments, the voltage source is configured to generate a voltage of 3 volts or less, such as 2.9 volts or less, 2.8 volts or less, 2.7 volts or less, 2.6 volts or less, 2.5 volts or less, 2.4 volts or less, 2.3 volts or less, 2.2, volts or less, 2.1 volts or less 2 volts or less, 1.5 volts or less, or 1 volt or less.

Another aspect of the invention provides a system including a mass spectrometry probe having a substrate in which a portion of the substrate is coated with a material, a portion of which protrudes from the substrate. A voltage source is coupled to the substrate, and a mass analyzer is operably associated with the system such that it receives ions generated from the mass spectrometry probe. In certain embodiments, the probe is discrete from a flow of solvent. In certain embodiments, the probe operates without pneumatic assistance. The mass analyzer can be for a bench-top mass spectrometer or a miniature mass spectrometer.

Another aspect of the invention provides a system including a mass spectrometry probe having carbon nanotubes, a voltage source coupled to the probe, and a mass analyzer. In certain embodiments, the carbon nanotubes alone make-up the probe. In other embodiments, the probe further includes a substrate (porous or non-porous) and the carbon nanotubes are coupled to the substrate.

BRIEF DESCRIPTION OF THE DRAWINGS

FIG. 6A shows triphenylphosphine. FIG. 6B shows tributylphosphine. FIG. 6C shows diphenylamine. FIG. 6D shows triethylamine. The upper and lower traces in each plot are on the same scale and show spectra before and after HCl addition, respectively.

FIG. 7A shows tetramethylammonium chloride. FIG. 7B shows tetramethylammonium bromide.

FIGS. 8A-B show Analysis of preformed ions (positive and negative ion modes) at 3 V. FIG. 8A shows tetramethylammonium iodide. FIG. 8B tetrabutylammonium iodide.

FIG. 11A is Crocine (paracetamol). FIG. 11B is xyzal (levocetirizine dihydrochloride). FIG. 11C is combiflam (paracetamol).

FIGS. 12A-H show detection of various amino acids (90 ng) loaded on CNT-coated paper and spectra recorded at 3 V. FIG. 12A is phenylalanine. FIG. 12B is methionine. FIG. 12C is glutamic acid. FIG. 12D is glutamine. FIG. 12E is isoleucine. FIG. 12F is valine. FIG. 12G is proline. FIG. 12H is serine.

FIG. 13A shows neutral molecules (30 ppm TTP in MeOH/H$_2$O) and preformed ions (tetramethylammonium bromide). FIG. 13B shows in positive ion mode. FIG. 13C shows in negative ion mode.

FIG. 15A is formic acid. FIG. 15B is acetic acid. FIG. 15C is propionic acid. FIG. 15D is butyric acid. FIG. 15E is pentanoic acid. The letter "D" represents proton bound dimer.

FIGS. 16A-D show detection of mixed dimer of various acid mixtures. FIG. 16A is acetic acid & butyric acid. FIG. 16B is propionic acid & butyric acid. FIG. 16C is acetic acid & pentanoic acid. FIG. 16D is formic acid & pentanoic acid. The letter "D" represents proton bound dimer.

FIGS. 17A-B show D/M ratio vs Voltage study for various acids in two different solvents. FIG. 17A is in water. FIG. 17B is in methanol.

FIG. 19A is chloride, FIG. 19B is bromide. FIG. 19C is iodide. FIG. 19D is acetate.

DETAILED DESCRIPTION

Figure 1A:
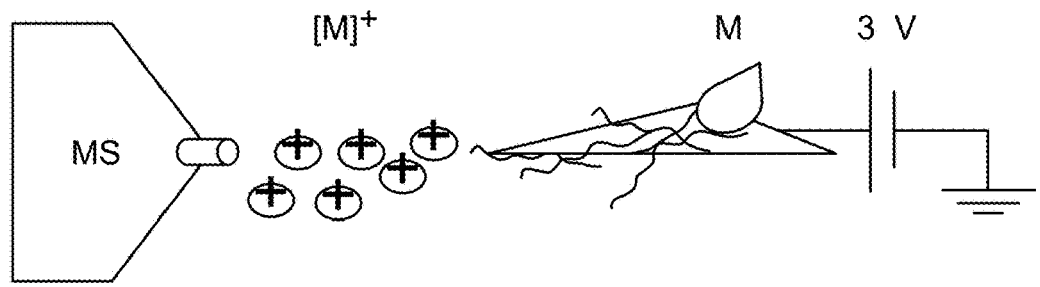
FIG. 1A is a schematic diagram of ionization from carbon nanotube (CNT) paper.

The invention generally relates to mass spectrometry probes and systems for ionizing a sample. In certain embodiments, the invention provides a mass spectrometry probe including a substrate in which a portion of the substrate is coated with a material, a portion of which protrudes from the substrate. With probes of the invention, pneumatic assistance is not required to transport an analyte; rather, a voltage (e.g., a low voltage of, for example, 3 volts or less) is simply applied to the substrate that is held in front of a mass spectrometer.

In certain embodiments, the substrate is kept discrete (i.e., separate or disconnected) from a flow of solvent, such as a continuous flow of solvent. Instead, sample is either spotted onto the substrate or swabbed onto it from a surface including the sample. The spotted or swabbed sample is then connected to a voltage source to produce ions of the sample which are subsequently mass analyzed. The sample is transported through the substrate without the need of a separate solvent flow. Pneumatic assistance is not required to transport the analyte; rather, a voltage is simply applied to the porous material that is held in front of a mass spectrometer.

In other embodiments, the substrate is coupled to a continuous solvent flow or a solvent reservoir so that the substrate can be continuously supplied with solvent. Such an exemplary set-up is described for example in Bare et al. (International patent application publication number WO 2012/170301), the content of which is incorporated by reference herein in its entirety.

The solvent may assist in separation/extraction and ionization. Any solvents may be used that are compatible with mass spectrometry analysis. In particular embodiments, favorable solvents will be those that are also used for electrospray ionization. Exemplary solvents include combinations of water, methanol, acetonitrile, and tetrahydrofuran (THF). The organic content (proportion of methanol, acetonitrile, etc. to water), the pH, and volatile salt (e.g. ammonium acetate) may be varied depending on the sample to be analyzed. For example, basic molecules like the drug imatinib are extracted and ionized more efficiently at a lower pH. Molecules without an ionizable group but with a number of carbonyl groups, like sirolimus, ionize better with an ammonium salt in the solvent due to adduct formation.

The material of the substrate can be electrically conductive or it can be an insulator. The substrate can be composed of a porous material or a non-porous material, or a combination thereof. Non-porous refers to materials that do not include through-holes that allow liquid or gas to pass through the material, exiting the other opposite side. Exemplary, non-porous materials include but are not limited to a metal, a plastic, a polymer, a glass, or a graphene.

Porous materials are described for example in Ouyang et al. (U.S. Pat. No. 8,859,956), the content of which is incorporated by reference herein in its entirety. In certain embodiments, the porous material is any cellulose-based material. In other embodiments, the porous material is a non-metallic porous material, such as cotton, linen wool, synthetic textiles, or plant tissue (e.g., a leaf). In still other embodiments, the porous material is paper. Advantages of paper include: cost (paper is inexpensive); it is fully commercialized and its physical and chemical properties can be adjusted; it can filter particulates (cells and dusts) from liquid samples; it is easily shaped (e.g., easy to cut, tear, or fold); liquids flow in it under capillary action (e.g., without external pumping and/or a power supply); and it is disposable.

In particular embodiments, the porous material is filter paper. Exemplary filter papers include cellulose filter paper, ashless filter paper, nitrocellulose paper, glass microfiber filter paper, and polyethylene paper. Filter paper having any pore size may be used. Exemplary pore sizes include Grade 1 (11 μm), Grade 2 (8 μm), Grade 595 (4-7 μm), and Grade 6 (3 μm), Pore size will not only influence the transport of liquid inside the spray materials, but could also affect the formation of the Taylor cone at the tip. The optimum pore size will generate a stable Taylor cone and reduce liquid evaporation. The pore size of the filter paper is also an important parameter in filtration, i.e., the paper acts as an online pretreatment device. Commercially available ultrafiltration membranes of regenerated cellulose, with pore sizes in the low nm range, are designed to retain particles as small as 1000 Da. Ultra filtration membranes can be commercially obtained with molecular weight cutoffs ranging from 1000 Da to 100,000 Da.

Substrates of the invention can be any shape and a sharp point is not required to generate ions using probes of the invention. For example, substrates of the invention can be rectangular, and ions can be generates along an edge of the rectangle, as opposed to a point at a corner of the rectangle. In particular embodiments, the porous material is shaped to have a macroscopically sharp point, such as a point of a triangle, for ion generation. Probes of the invention may have different tip widths. In certain embodiments, the probe tip width is at least about 5 μm or wider, at least about 10 μm or wider, at least about 50 μm or wider, at least about 150 μm or wider, at least about 250 μm or wider, at least about 350 μm or wider, at least about 400μ or wider, at least about 450 μm or wider, etc. In particular embodiments, the tip width is at least 350 μm or wider. In other embodiments, the probe tip width is about 400 μm. In other embodiments, probes of the invention have a three dimensional shape, such as a conical shape. In certain embodiments, the substrate tapers to a tip, such as a substrate including a planar portion that tapers to a tip. An exemplary shape is a triangular substrate that tapers to a tip.

With probes of the invention, a portion or an entirety of the substrate is coated with a material. The coating is applied to the substrate such that one or more portions of the material protrude from the substrate. Generally, these protrusions are on the nanoscale (nanometer features) and, without being limited by any particular theory or mechanism of action, act as an electrode. The protrusions provide a field strength high enough to cause field emission of microscale solution droplets containing analyte at these nanoscale protrusions. In that manner, mass spectrometry probes of the invention are able to ionize a target analyte through the application of a low voltage (e.g., 3 volts or less), rather than a high voltage, allowing for ionization without unwanted fragmentation of the target analyte.

In certain embodiments, the material is an electrically conductive material, although that is not required, because a solvent surrounding the material can be an electrolyte in some cases. Any electrically conductive material may be used with probes of the invention. An exemplary material includes electrically conductive nanotubes. Nanotubes are nanometer-scale tube-like structure. Exemplary nanotubes are carbon nanotubes, silicon nanotubes, boron nitride nanotubes, or inorganic nanotubes (i.e., nanotubes formed of metal oxides, or group III-Nitrides). Typically, the nanotubes coat an external surface of the substrate, and a portion (such as a distal portion) of a plurality of the nanotubes protrude from the surface of the substrate. It is also possible for portions of the nanotubes, or any chosen material, to impregnate the substrate. In certain embodiments, the nanotubes are carbon nanotubes, which are described for example in Monthioux et al. (Carbon 44 (9): 1621, 2006), Oberlin et al. (Journal of Crystal Growth 32 (3): 335-349, 1976), Endo et al. (Carbon 37 (11): 1873, 2002), Izvestiya wet al. (Metals. 1982, #3, pp. 12-17), Tennent (U.S. Pat. No. 4,663,230), Iijima et al. (Nature 354 (6348): 56-58, 1991), Mintmire et al., (Phys. Rev. Lett. 68 (5): 631-634, 1992), Bethune (Nature 363 (6430): 605-607, 1993), Iijima et al., (Nature 363 (6430): 603-605, 1993), Krätschmer et al. (Nature 347 (6291): 354-358, 1990), and Kroto et al. (Nature 318 (6042): 162-163, 1985), the content of each of which is incorporated by reference herein in its entirety.

Carbon nanotubes (CNTs) are allotropes of carbon with a cylindrical nanostructure. Carbon nanotubes are members of the fullerene structural family. Their name is derived from their long, hollow structure with the walls formed by one-atom-thick sheets of carbon, called graphene. These sheets are rolled at specific and discrete ("chiral") angles, and the combination of the rolling angle and radius decides the nanotube properties; for example, whether the individual nanotube shell is a metal or semiconductor. Carbon nanotubes are categorized as single-walled nanotubes (SWNTs) and multi-walled nanotubes (MWNTs), and both may be used with probes of the invention.

Most single-walled nanotubes (SWNT) have a diameter of close to 1 nanometer, with a tube length that can be many millions of times longer. The structure of a SWNT can be conceptualized by wrapping a one-atom-thick layer of graphite called graphene into a seamless cylinder. The way the graphene sheet is wrapped is represented by a pair of indices (n,m). The integers n and m denote the number of unit vectors along two directions in the honeycomb crystal lattice of graphene. If m=0, the nanotubes are called zigzag nanotubes, and if n=m, the nanotubes are called armchair nanotubes. Otherwise, they are called chiral. The diameter of an ideal nanotube can be calculated from its (n,m) indices as follows:

$$d = \frac{a}{\pi}\sqrt{(n^2 + nm + m^2)} = 78.3\sqrt{((n+m)^2 - nm)}\ pm,$$

where a=0.246 nm.

Multi-walled nanotubes (MWNT) consist of multiple rolled layers (concentric tubes) of graphene. There are two models that can be used to describe the structures of multi-walled nanotubes. In the Russian Doll model, sheets of graphite are arranged in concentric cylinders, e.g., a (0.8) single-walled nanotube (SWNT) within a larger (0.17) single-walled nanotube. In the Parchment model, a single sheet of graphite is rolled in around itself, resembling a scroll of parchment or a rolled newspaper. The interlayer distance in multi-walled nanotubes is close to the distance between graphene layers in graphite, approximately 3.4 Å. The Russian Doll structure is observed more commonly. Its individual shells can be described as SWNTs, which can be metallic or semiconducting. Because of statistical probability and restrictions on the relative diameters of the individual tubes, one of the shells, and thus the whole MWNT, is usually a zero-gap metal.

As used herein, the term carbon nanotubes includes carbon nanobuds, which are a combination of carbon nanotubes and fullerenes. In carbon nanobuds, fullerene-like buds are covalently bonded to the outer sidewalls of the underlying carbon nanotube. This hybrid material has useful properties of both fullerenes and carbon nanotubes. In particular, they have been found to be exceptionally good field emitters. In composite materials, the attached fullerene molecules may function as molecular anchors preventing slipping of the nanotubes, thus improving the composite's mechanical properties.

As used herein, the term carbon nanotubes also includes graphenated CNTs, which are a hybrid that combines graphitic foliates grown along the sidewalls of multiwalled or bamboo style CNTs. Graphenated CNTs are described for example in Yu et al. (J. Phys. Chem. Lett. 13 2 (13): 1556-1562, 2011), and Stoner et al. (Appl. Phys. Lett. 18 99 (18): 183104, 2011), the content of each of which is incorporated by reference herein in its entirety.

As used herein, the term carbon nanotubes also includes: doped carbon nanotubes, such as nitrogen doped carbon nanotubes (Kouvetakis et al., Chemistry of Materials 6 (6): 811, 1994; Zhong et al., Journal of Physics and Chemistry of Solids 71 (2): 134, 2010; Yin et al., Advanced Materials 15 (21): 1840, 2003; and Oku et al., Diamond and Related Materials 9 (3-6): 906, 2000); and a carbon peapod, which is a hybrid carbon material which traps fullerene inside a carbon nanotube (Smith et al., Nature 396: 323-324, 1998; and Smith et al., Chem. Phys. Lett. 321: 169-174, 2000).

Figure 14:
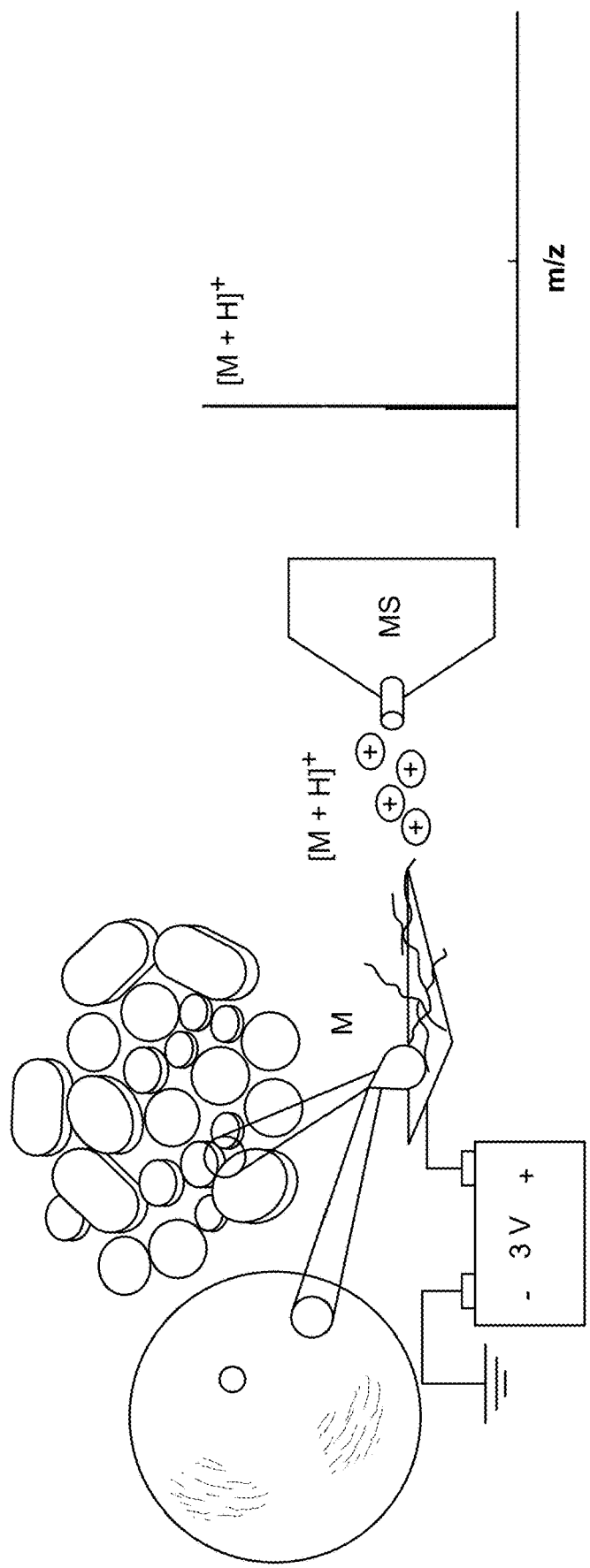
FIG. 14 is a schematic illustrating a system of the invention for analysis of various different types of samples. The mass spectrometry probe is illustrated to be coated with carbon nanotubes.
Figure 15A:
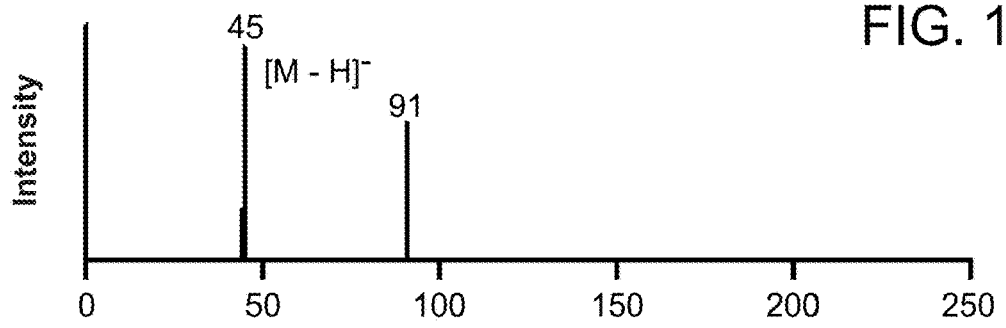
FIGS. 15A-E show detection of proton bound dimer of various acids at 1V.
Figure 15B:
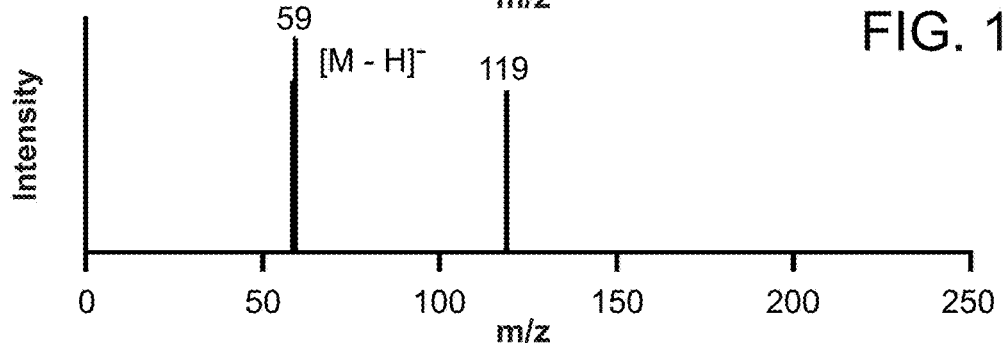
Figure 15C:
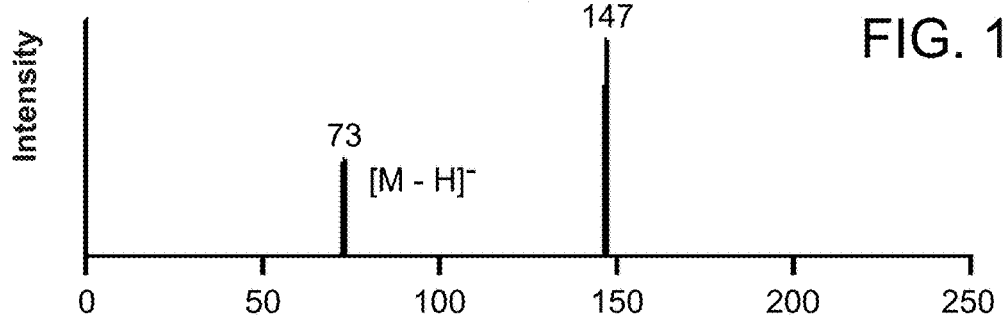
Figure 15D:
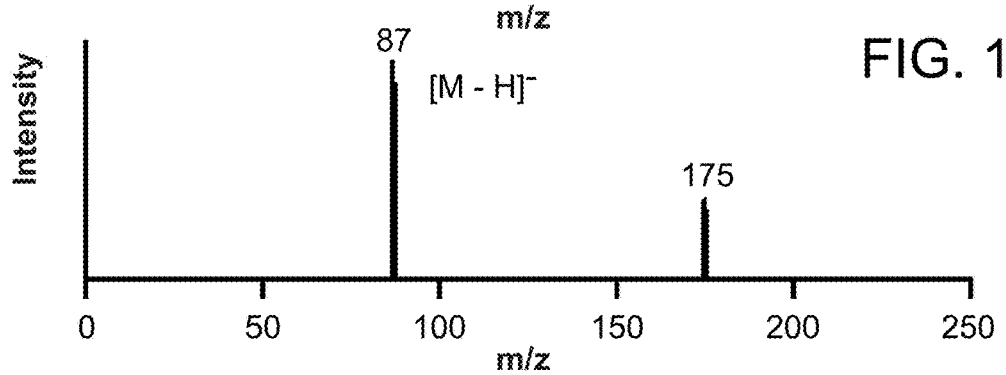
Figure 15E:
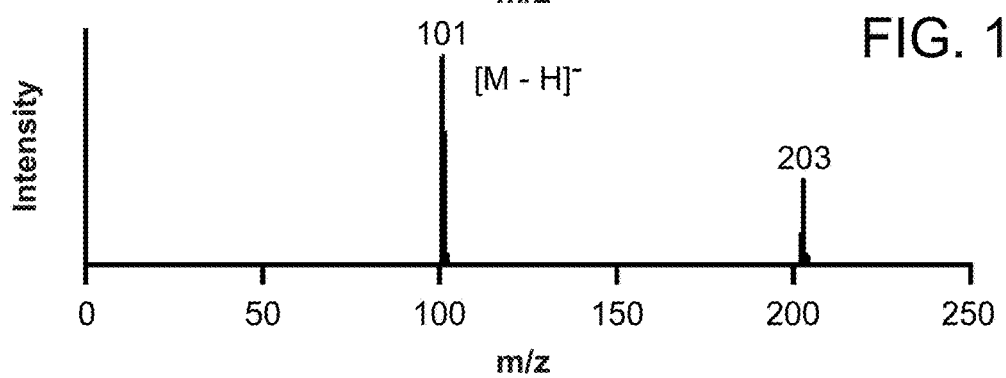

An exemplary system using a carbon nanotube probe of the invention is shown in FIG. 14. As described in the Examples below, a carbon nanotube (CNT) coated/impregnated paper can be used to generate ions from organic molecules at potentials at 3 V or lower. Common pesticides from the surface of an orange, ingredients of medicinal tablets and a variety of analytes such as amino acids have been characterized using probes and systems of the invention.

In certain embodiments, the material is an electrically conductive fibrous material, such that portions of a plurality of the fibers protrude from the substrate. Exemplary fibers are metal or carbon fibers, or metal or carbon nanowires. Those fibers can be hollow or solid. In certain embodiments, the protrusions are printed as nanometer features (electrically conductive or not based on the material used in the process) onto the substrate (a printed coating). Dip pen nanolithography can be used for this process, as described in Ginger et al. (Angewandte Chemie International Edition 43 (1): 30-45, 2004) or other known processes may be used, such as described for example in Yueh-Lin et al. (Appl. Phys. Lett., 81(3):562-564, 2002), the content of each which is incorporated by reference herein in its entirety.

Mass spectrometry probes of the invention are typically coupled to a voltage source. In certain embodiments, the voltage source is a low voltage source, that is, a voltage source configured to generate a voltage of 3 volts or less, such as 2.9 volts or less, 2.8 volts or less, 2.7 volts or less, 2.6 volts or less, 2.5 volts or less, 2.4 volts or less, 2.3 volts or less, 2.2 volts or less, 2.1 volts or less 2 volts or less, 1.5 volts or less, or 1 volt or less. In other embodiments, a high voltage source (e.g., greater than 3 volts) is coupled to the probes of the invention. Such couplings are known in the art.

Mass spectrometry probes of the invention can be interfaced with mass spectrometers for analysis of samples. As mentioned above, no pneumatic assistance is required to transport the droplets. Ambient ionization of analytes is realized on the basis of these charged droplets, offering a simple and convenient approach for mass analysis of solution-phase samples. Sample solution is directly applied on the probe held in front of an inlet of a mass spectrometer without any pretreatment. Then the ambient ionization is performed by applying a potential (high or low) to the probe.

Any type of mass spectrometer known in the art can be used with proves of the invention. For example, the mass spectrometer can be a standard, bench-top mass spectrometer. In other embodiments, the mass spectrometer is a miniature mass spectrometer. An exemplary miniature mass spectrometer is described, for example in Gao et al. (Z. Anal. Chem. 2006, 78, 5994-6002), the content of which is incorporated by reference herein in its entirety In comparison with the pumping system used for lab-scale instruments with thousands watts of power, miniature mass spectrometers generally have smaller pumping systems, such as a 18 W pumping system with only a 5 L/min (0.3 m3/hr) diaphragm pump and a 11 L/s turbo pump for the system described in Gao et al. Other exemplary miniature mass spectrometers are described for example in Gao et al. (Anal. Chem., 80:7198-7205, 2008), Hou et al. (Anal. Chem., 83:1857-1861, 2011), and Sokol et al. (Int. J. Mass Spectrom., 2011, 306, 187-195), the content of each of which is incorporated herein by reference in its entirety. Miniature mass spectrometers are also described, for example in Xu et al. (JALA, 2010, 15, 433-439); Ouyang et al. (Anal. Chem., 2009, 81, 2421-2425); Ouyang et al. (Ann. Rev. Anal. Chem., 2009, 2, 187-214); Sanders et al. (Euro. J. Mass Spectrom., 2009, 16, 11-20); Gao et al. (Anal. Chem., 2006, 78(17), 5994-6002); Mulligan et al. (Chem. Com., 2006, 1709-1711); and Fico et al. (Anal. Chem., 2007, 79, 8076-8082).), the content of each of which is incorporated herein by reference in its entirety.

In certain embodiments, systems of the invention are equipped with a discontinuous interface, which is particularly useful with miniature mass spectrometers. An exemplary discontinuous interface is described for example in Ouyang et al. (U.S. Pat. No. 8,304,718), the content of which is incorporated by reference herein in its entirety. In certain embodiments, it is advantage to heat the sample during analysis. Accordingly, in certain embodiments, mass spectrometry probes of the invention are configured with a heating element, such as described in Cooks et al. (U.S. patent application publication number 2013/0344610), the content of which is incorporated by reference herein in its entirety.

In certain embodiments, methods and systems of the invention use a porous material, e.g., paper, to hold and transport analytes for mass spectral analysis. Analytes in samples are pre-concentrated, enriched and purified in the porous material in an integrated fashion for generation of ions with application of a voltage (low or high) to the porous material. In certain embodiments, a discrete amount of transport solution (e.g., a droplet or a few droplets) is applied to assist movement of the analytes through the porous material. In certain embodiments, the analyte is already in a solution that is applied to the porous material. In such embodiments, no additional solvent need be added to the porous material. In other embodiments, the analyte is in a powdered sample that can be easily collected by swabbing a surface. Systems and methods of the invention allow for analysis of plant or animal tissues, or tissues in living organisms.

Methods and systems of the invention can be used for analysis of a wide variety of small molecules, including epinephrine, serine, atrazine, methadone, roxithromycin, cocaine and angiotensin I or molecular complexes (e.g., protein and peptide complexes). All display high quality mass and MS/MS product ion spectra from a variety of porous surfaces. Methods and systems of the invention allow for use of small volumes of solution, typically a few μl, with analyte concentrations on the order of 0.1 to 10 μg/mL (total amount analyte 50 pg to 5 ng) and give signals that last from one to several minutes.

Methods and systems of the invention can be used also for analysis of a wide variety of biomolecules, including proteins and peptides and bimolecular complex (protein or peptide complexes). Methods of the invention can also be used to analyze oligonucleotides from gels. After electrophoretic separation of oligonucleotides in the gel, the band or bands of interest are blotted with porous material using methods known in the art. The blotting results in transfer of at least some of the oligonucleotides in the band in the gel to the probes of the invention. The probe is then connected to a voltage source and the oligonucleotides are ionized and sprayed into a mass spectrometer for mass spectral analysis.

Methods and systems of the invention can be used for analysis of complex mixtures, such as whole blood or urine. The typical procedure for the analysis of pharmaceuticals or other compounds in blood is a multistep process designed to remove as many interferences as possible prior to analysis. First, the blood cells are separated from the liquid portion of blood via centrifugation at approximately 1000×g for 15 minutes (Mustard, J. R; Kinlough-Rathbone, R. L.; Packham, M. A. Methods in Enzymology; Academic Press, 1989). Next, the internal standard is spiked into the resulting plasma and a liquid-liquid or solid-phase extraction is performed with the purpose of removing as many matrix chemicals as possible while recovering nearly all of the analyte (Buhrman, D. L.; Price, P. I.; Rudewicz, P. J. Journal of the American Society for Mass Spectrometry 1996, 7, 1099-1105). The extracted phase is typically dried by evaporating the solvent and then resuspended in the a solvent used as the high performance liquid chromatography (HPLC) mobile phase (Matuszewski, B. K.; Constanzer, M. L.; Chavez-Eng, C. M., Ithaca, N.Y., Jul. 23-25 1997; 882-889). Finally, the sample is separated in the course of an HPLC run for approximately 5-10 minutes, and the eluent is analyzed by electrospray ionization-tandem mass spectrometry (Hopfgartner, G.; Bourgogne, E. Mass Spectrometry Reviews 2003, 22, 195-214).

Methods and systems of the invention avoid the above sample work-up steps. Methods and systems of the invention analyze a dried blood spots in a similar fashion, with a slight modification to the extraction procedure. First, a specialized device is used to punch out identically sized discs from each dried blood spot. The material on these discs is then extracted in an organic solvent containing the internal standard (Chace, D. H.; Kalas, T. A.; Naylor, E. W. Clinical Chemistry 2003, 49, 1797-1817). The extracted sample is dried on the paper substrate, and the analysis proceeds as described herein.

Methods and systems of the invention can directly detect individual components of complex mixtures, such as caffeine in urine, 50 pg of cocaine on a human finger, 100 pg of heroin on a desktop surface, and hormones and phospholipids in intact adrenal tissue, without the need for sample preparation prior to analysis. Methods and systems of the invention allow for simple imaging experiments to be performed by examining, in rapid succession, needle biopsy tissue sections transferred directly to paper.

Analytes from a solution are applied to the probe for examination and the solvent component of the solution can serve as the electrospray solvent. In certain embodiments, analytes (e.g., solid or solution) are pre-spotted onto the porous material, e.g., paper, and a solvent is applied to the material to dissolve and transport the analyte into a spray for mass spectral analysis.

In certain embodiments, a solvent is applied to the porous material to assist in separation/extraction and ionization. Any solvents may be used that are compatible with mass spectrometry analysis. In particular embodiments, favorable solvents will be those that are also used for electrospray ionization. Exemplary solvents include combinations of water, methanol, acetonitrile, and THF. The organic content (proportion of methanol, acetonitrile, etc. to water), the pH, and volatile salt (e.g. ammonium acetate) may be varied depending on the sample to be analyzed. For example, basic molecules like the drug imatinib are extracted and ionized more efficiently at a lower pH. Molecules without an ionizable group but with a number of carbonyl groups, like sirolimus, ionize better with an ammonium salt in the solvent due to adduct formation.

In certain embodiments, a multi-dimensional approach is undertaken. For example, the sample is separated along one dimension, followed by ionization in another dimension. In these embodiments, separation and ionization can be individually optimized, and different solvents can be used for each phase.

In other embodiments, transporting the analytes on the probe is accomplished by a solvent in combination with an electric field. When an electric potential is applied, the direction of the movement of the analytes on the probe is found to be related to the polarity of their charged forms in solution. Pre-concentration of the analyte before the spray can also be achieved on the probe by placing an electrode at a point on the probe. By placing a ground electrode near the tip, a strong electric field is produced through the probe when a DC voltage is applied, and charged analytes are driven forward under this electric field. Particular analytes may also be concentrated at certain parts of the probe before the spray is initiated.

In certain embodiments, chemicals are applied to the probe to modify the chemical properties of the probe. For example, chemicals can be applied that allow differential retention of sample components with different chemical properties. Additionally, chemicals can be applied that minimize salt and matrix effects. In other embodiments, acidic or basic compounds are added to the porous material to adjust the pH of the sample upon spotting. Adjusting the pH may be particularly useful for improved analysis of biological fluids, such as blood. Additionally, chemicals can be applied that allow for on-line chemical derivatization of selected analytes, for example to convert a non-polar compound to a salt for efficient electrospray ionization.

In certain embodiments, the chemical applied to modify the porous material is an internal standard. The internal standard can be incorporated into the material and released at known rates during solvent flow in order to provide an internal standard for quantitative analysis. In other embodiments, the porous material is modified with a chemical that allows for pre-separation and pre-concentration of analytes of interest prior to mass spectrum analysis.

The spray droplets can be visualized under strong illumination in the positive ion mode and are comparable in size to the droplets emitted from a nano-electro spray ion sources (nESI). In the negative ion mode, electrons are emitted and can be captured using vapor phase electron capture agents like benzoquinone.

The methodology described here has desirable features for clinical applications, including neotal screening, therapeutic drug monitoring and tissue biopsy analysis. The procedures are simple and rapid. The porous material serves a secondary role as a filter, e.g., retaining blood cells during analysis of whole blood. Significantly, samples can be stored on the porous material and then analyzed directly from the stored porous material at a later date without the need transfer from the porous material before analysis. Systems of the invention allow for laboratory experiments to be performed in an open laboratory environment.

Incorporation by Reference

References and citations to other documents, such as patents, patent applications, patent publications, journals, books, papers, web contents, have been made throughout this disclosure. All such documents are hereby incorporated herein by reference in their entirety for all purposes.

Equivalents

Various modifications of the invention and many further embodiments thereof, in addition to those shown and described herein, will become apparent to those skilled in the art from the full contents of this document, including references to the scientific and patent literature cited herein. The subject matter herein contains important information, exemplification and guidance that can be adapted to the practice of this invention in its various embodiments and equivalents thereof.

EXAMPLES

The Examples below illustrate certain embodiments of the invention in which ambient ionization is achieved by spraying from a carbon nanotube (CNT) paper surface under the influence of small voltages ($\geq 1V$). Organic molecules give simple high quality mass spectra without fragmentation in the positive or negative ion modes. Conventional field ionization is ruled out and field emission of microdroplets is indicated. Microscopic examination of the CNT paper confirms the nanoscale features at the modified paper surface are responsible for high electric fields. Raman spectra imply substantial current flows in the nanotubes. Analytical performance is shown with volatile and non-volatile compounds and a variety of matrices.

Example 1

Materials and Probe Preparation

Multi-walled carbon nanotubes (MWNTs), referred to as CNTs were using to form probes of the invention. They were dispersed in water (2 mg in 25 mL water) using sodium dodecyl sulfate (6 mg) as a surfactant (K. Moshammer, F. Hennrich, M. M. Kappes, Nano Res. 2009, 2, 599-606). This CNT suspension was drop cast onto Whatman 42 filter paper (3 µL of the CNT suspension coating 5 mm$^2$). Then the paper was dried in air and cut into triangles with dimensions 2×5 mm (base×height). The CNT-coated paper triangle was connected to a 3 V battery and held close (2 mm) to the mass spectrometer inlet. Then it was loaded with sample (typically as 30 ppm solutions). The volume of solvent used was 2 µL and repeated measurements using the same paper used the same aliquot of pure solvent. All measurements were made at 3 V. Mass spectra were recorded in the positive ion mode for all analytes except preformed ions. For preformed ions derived from salts, both positive and negative ion mode spectra were recorded at ±3V. All spectra were recorded under the following experimental conditions: solvent methanol/water (1:1), source voltage ±3V, capillary temperature 150° C., capillary voltage ±15 V, and tube lens voltage ±55 V.

Single walled carbon nanotubes (SWNTs) were also used for the measurements. The following parameters were used for all the ESI experiments: Source voltage −5 kV, sheath gas (nitrogen) flow rate 8 (manufacturer's unit), solvent flow rate 2 µL/min and all other parameters were same as paper spray. All ESI mass spectra correspond to an average of 100 scans.

SWCNTs and MWCNTs were purchased from Nanocyl s.a, USA; SDS from RFCL Ltd., Gujarat, India; triphenylphosphine from Spectrochem Pvt. Ltd., Mumbai, India; tributylphosphine from Wako Pure Chemical Industries Ltd.; diphenylamine and triethylamine from Merck Ltd., Mumbai, India. The pesticides, carbofuran, methyl parathion and parathion, were purchased from Sigma Aldrich, India. All the medical tablets used (Crocin, Combiflam and Xyzal, all trade names) were purchased from a local pharmacy. Amino acids used in the experiments were purchased from Sisco Research Laboratories Pvt. Ltd., Mumbai, India. All analytes (other than pesticides and tablets) were used at 30 ppm concentration. HPLC grade methanol (Sigma Aldrich) and MeOH/water 1:1 were used as solvents.

All mass spectra were recorded using an ion trap LTQ XL (Thermo Scientific, San Jose, Calif.). MS$^2$ analysis using collision-induced dissociation was performed to confirm the identity of the ions. Raman measurements were made using a Witec GmbH Confocal Raman Microspectrometer, Germany with 532 nm and 633 nm laser excitations. A FEI make field emission SEM was used to image the CNT-coated paper samples.

Example 2

Sample Analysis Using Probes of the Invention

This example shows that ionization can be achieved from a substrate coated/impregnated with carbon nanotubes (CNTs) at a potential of just a few volts. The high electric fields produced at the small CNT protrusions are suggested to be the reason for low voltage ionization which appears to occur by field emission of charged microdroplets (Xu et al., Anal. Chem. 1996, 68, 4244-4253; and Wang et al., Anal. Chim. Acta 2000, 406, 53-65). Various analytes applied to the tip of the coated paper are detectable in small amounts. Neutral molecules typically appear as either their protonated or deprotonated forms while salts yield both positive and negative ions. The fact that a high voltage (HV) is not needed sets this method apart from other spray ambient ionization methods.

Figure 1B:
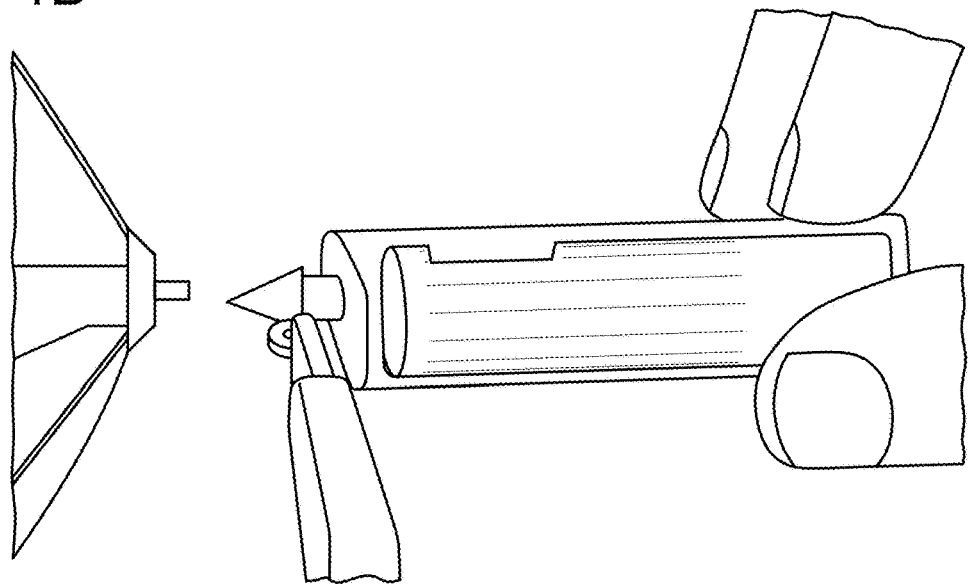
FIG. 1B is a photograph of the ionization source showing a paper triangle and battery along with a grounding electrical connection.
Figure 2:
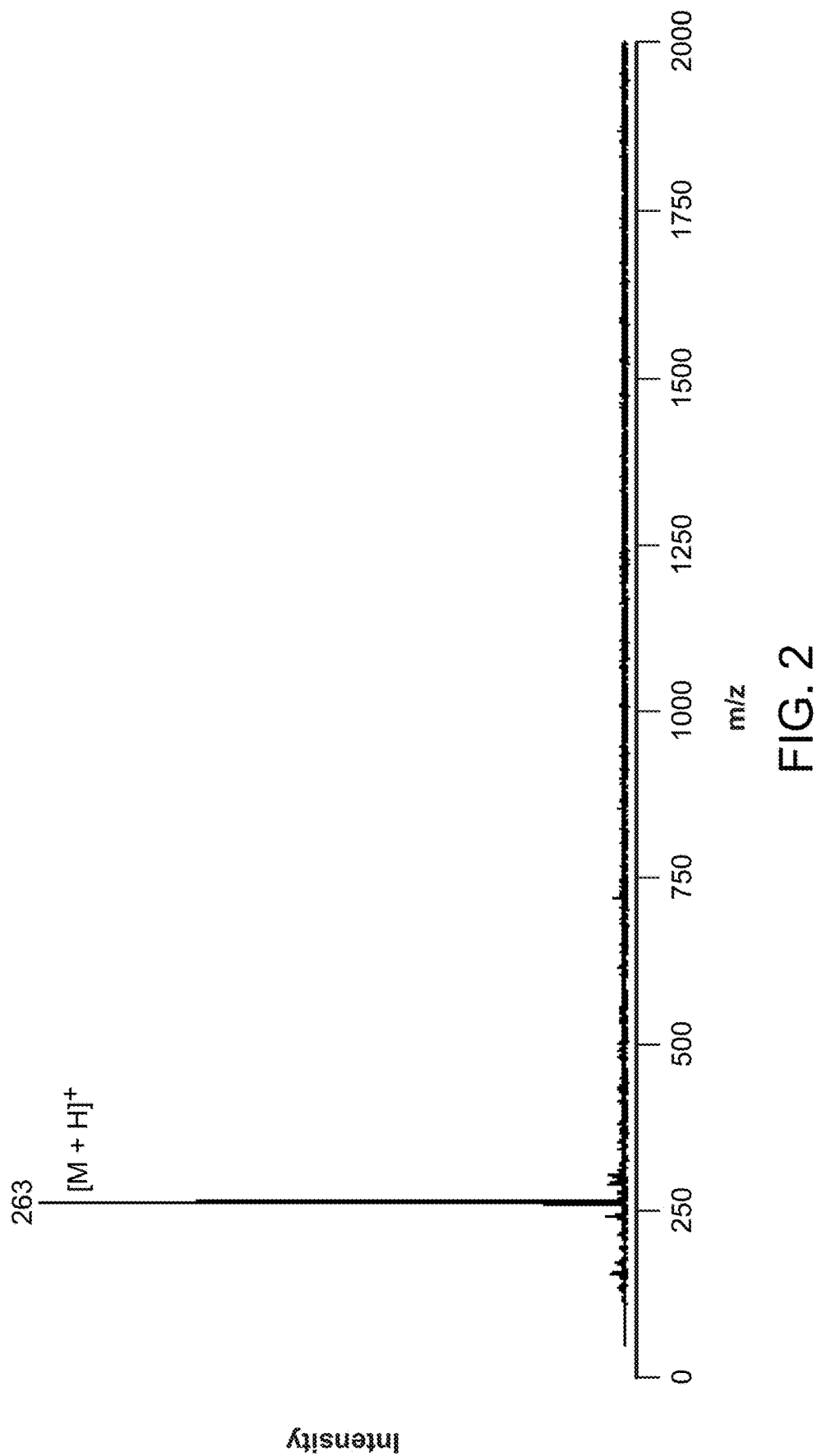
FIG. 2 is a full range mass spectrum of triphenylphosphine at 3 V.
Figure 3:
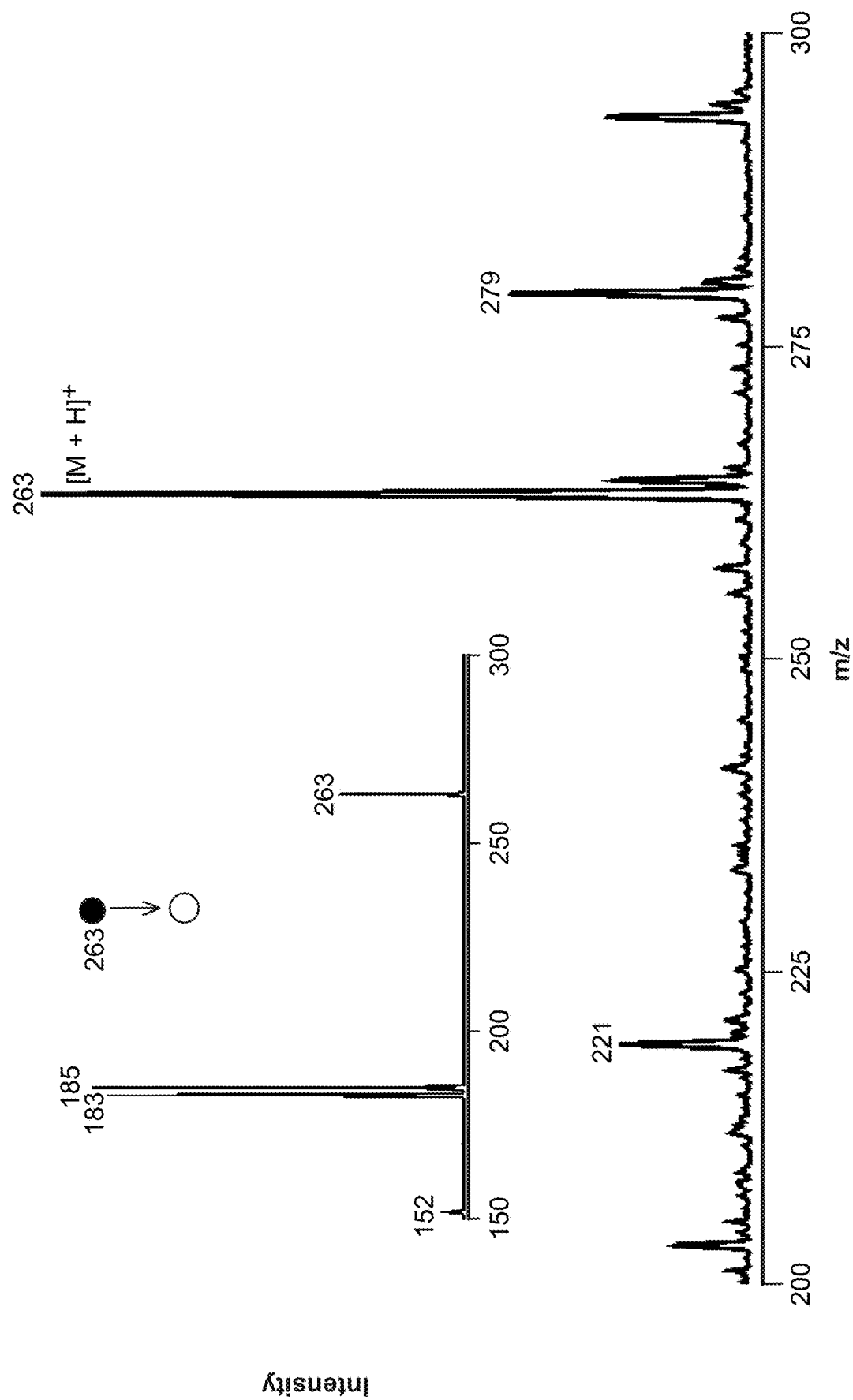
FIG. 3 is an ESI mass spectrum (MeOH:H$_2$O, 1:1) of triphenylphosphine at 3 kV. The spectrum shows an enhanced oxidation peak at m/z 279 and its C$_6$H$_6$ fragment at m/z 221, in comparison to the CNT-coated paper (FIG. 1C). MS/MS spectrum is shown in the inset.

Experiments were done with triangles of CNT-coated paper, wet with MeOH/water and connected to a 3 V battery (FIGS. 1A-B). Mass spectra recorded for triphenylphosphine (TPP) using the CNT paper and 3 V battery source (FIG. 1C) exhibited a peak at m/z 263 due to protonated triphenylphosphine, [M+H]$^+$. Spectra could be collected for 2-3 sec using 2 μL of solvent. The full range mass spectrum of TPP on CNT-coated paper (FIG. 2) is similar to the ESI mass spectrum recorded at 3 kV (FIG. 3). Although the intensity of the molecular ion at 3 V is as much at 104 times less than that seen in ESI, the conditions are less harsh, in particular the oxidation product at m/z 279 as well as that of a trace homologous impurity (product at m/z 293) are absent, as are their fragmentation products at m/z 203 and m/z 219. Moreover, the mass spectrum shows a well-defined isotopic pattern (FIG. 1E) of the molecular ion and confirmation of its structure comes from tandem mass spectrometric data (FIG. 1F) which show the expected benzene loss and associated further loss of H$_2$ upon collision induced dissociation.

Figure 1C:
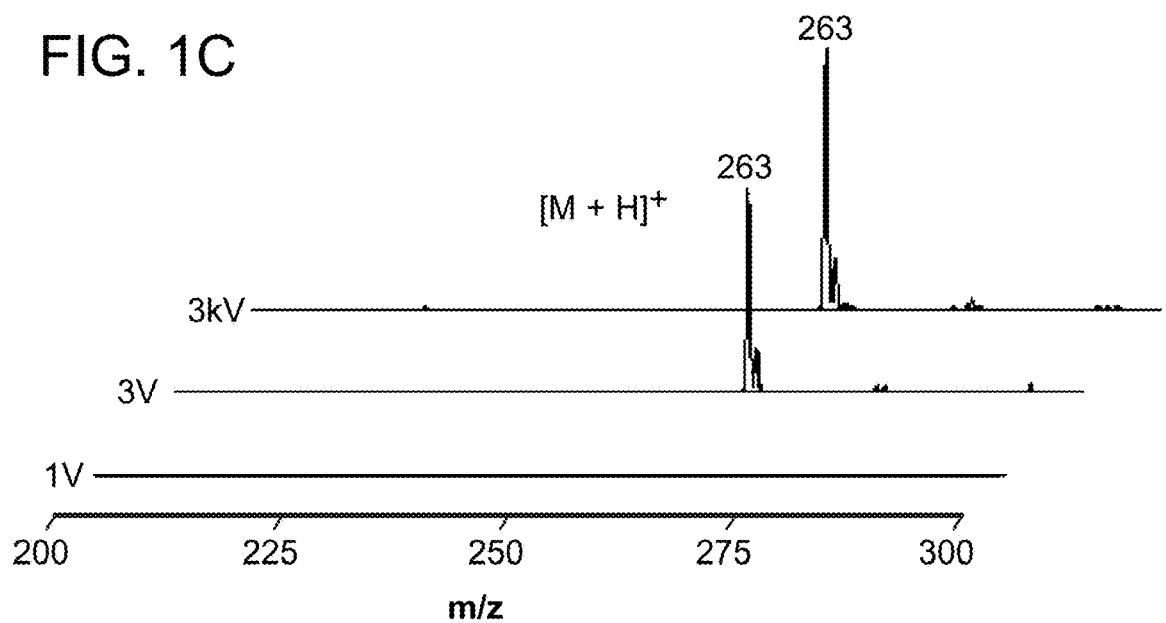
FIG. 1C is a mass spectra of triphenylphosphine (M) at 3 kV, 3 V and 1 V from wet CNT paper.
Figure 1D:
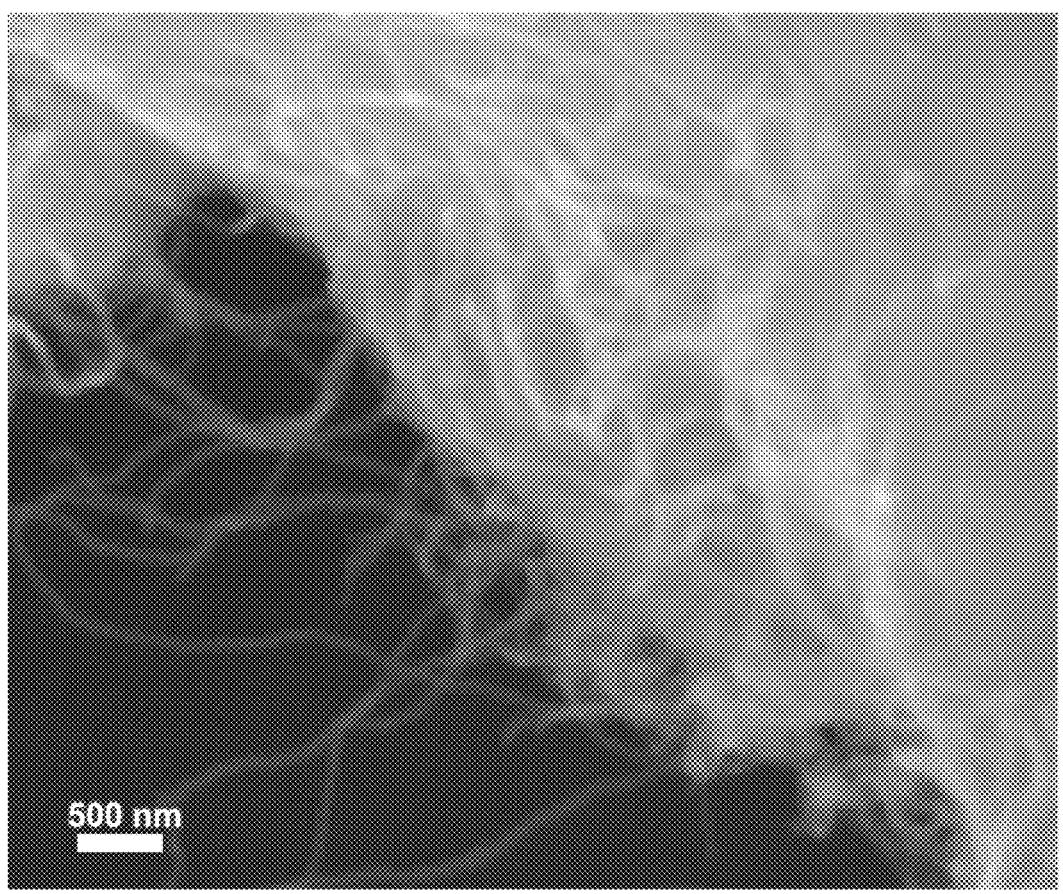
FIG. 1D is a field emission-scanning electron microscopy (FE-SEM) image of CNT-coated paper.
Figure 1E:
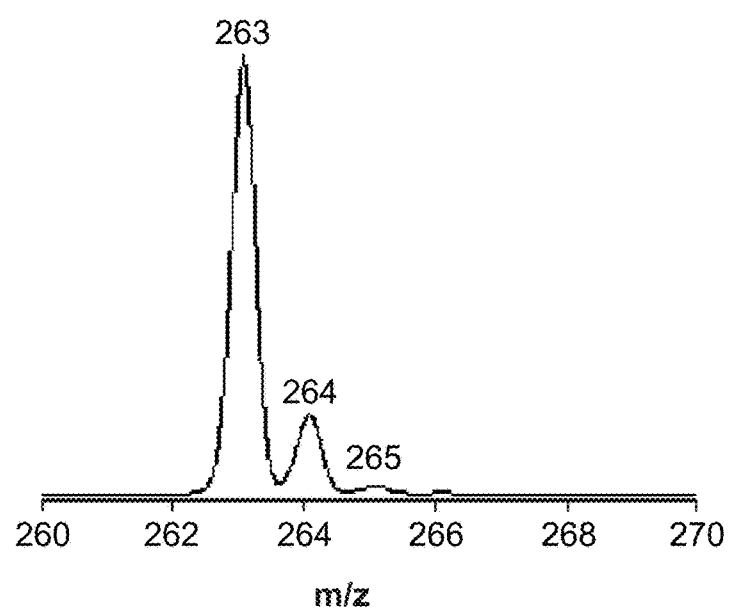
FIG. 1E is an isotope distribution of the protonated molecule at 3 V.
Figure 1F:
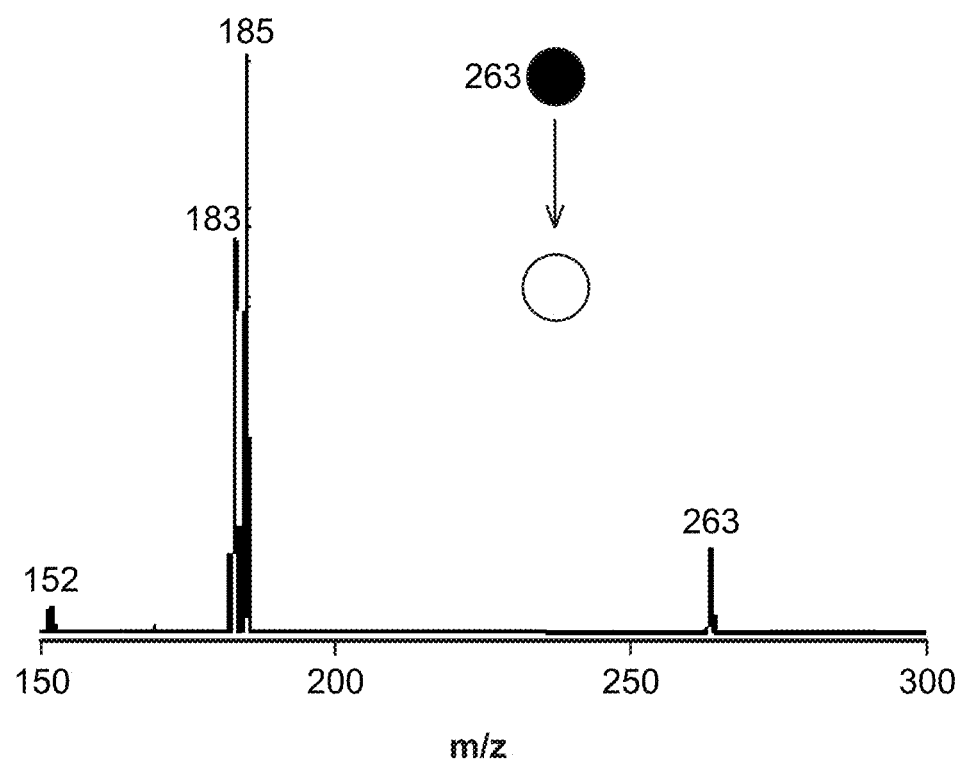
FIG. 1F is a product ion $MS^2$ of m/z 263.

An increase in the applied potential increases the ion intensity, saturating at 4 kV, at which point the signal was almost of the same magnitude as the ESI signal. However, no additional features were observed. The two spectra (at 3 kV and 3 V, both from CNT coated paper) shown in FIG. 1C are identical in terms of the ions observed. A minimum applied voltage of 3 V is essential for detectable ion signals. Control experiments confirmed the fact that CNTs assisted in the ionization process at 3 V. Filter paper (without the CNT-coating) but cut similarly and using the same solvent was not as effective at producing detectable ions with a range of analytes, even up to 500 V. Closer examination of the edge of the paper shows protruding nanotubes (FIG. 1D). From these results and experiments described below, it is suggested that field emission of microscale solution droplets containing analyte occurs at these nanoscale protrusions and this is responsible for the observed ionization event.

Additional experiments were conducted to explore the mechanism of ionization. Clearly the absence of fragment ions in the mass spectrum may be attributed to the occurrence of soft ionization events. The occurrence of ionization at 3 V strongly implies a process associated with a very high electric field. The field must be due to the small conductive CNT structures (FIG. 1D) protruding from the surface of the filter paper and acting as an electrode (Gruener wet al., J. Fortagh, Phys. Rev. A: At., Mol., Opt. Phys. 2009, 80). The voltage (from the battery) applied at the CNT electrode induces an electric field between the paper tip and the mass spectrometer inlet. The field intensity is high at the paper tip, where ionization occurs.

Figure 4:
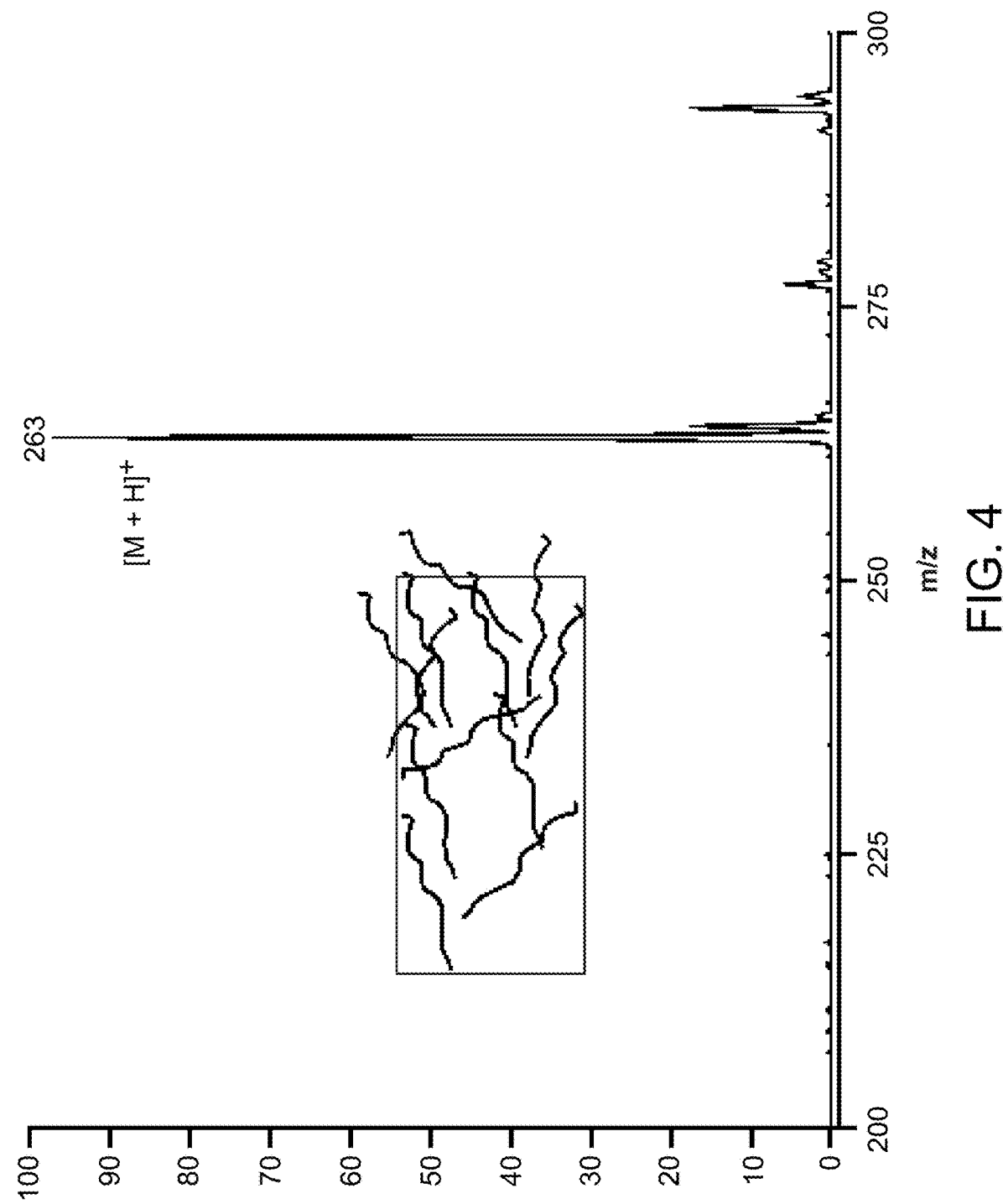
FIG. 4 is a spectrum produced using rectangular CNT-coated paper and the inset shows the schematic of the paper (with mass spectrometer facing one side of it).
Figure 5A:
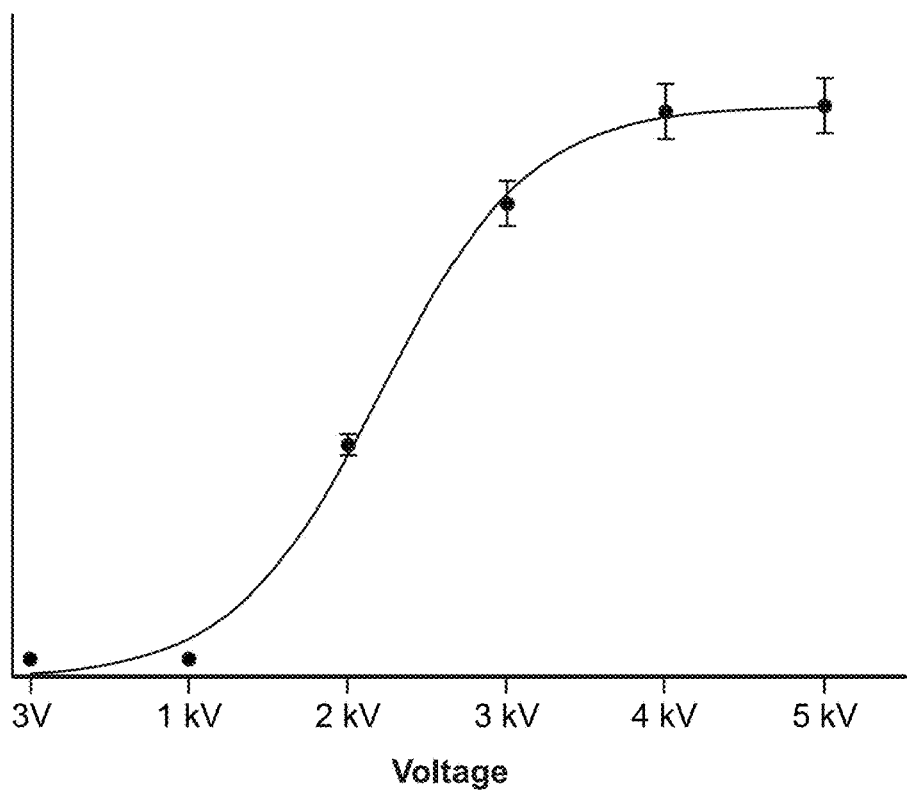
FIG. 5A shows the variation of intensity of the m/z 263 peak with voltage for CNT-coated paper.
Figure 5B:
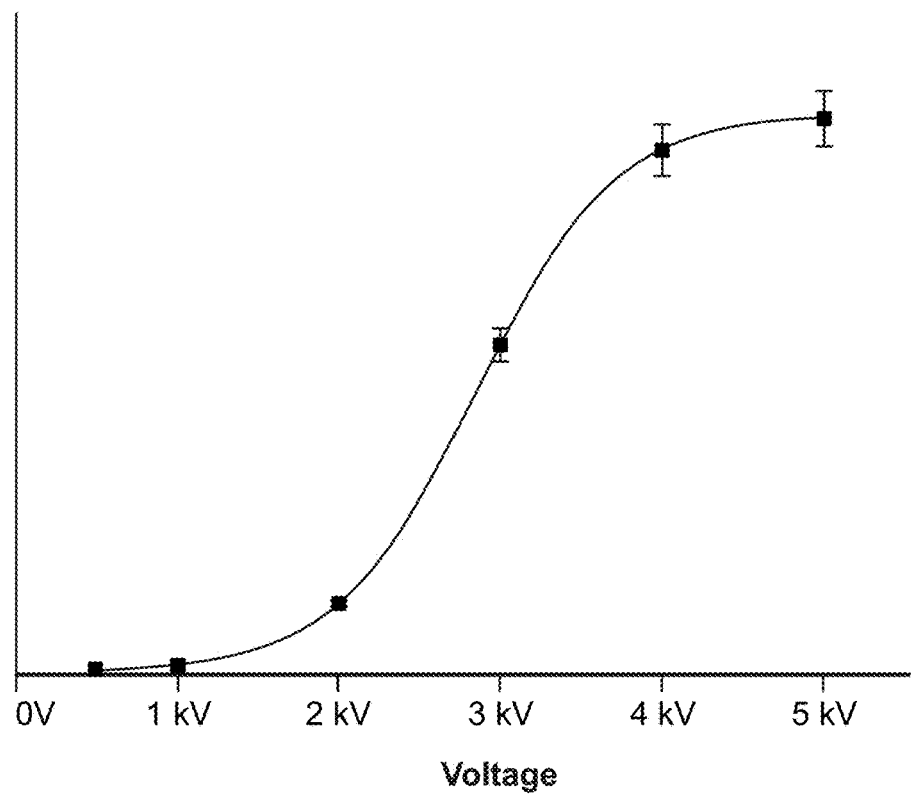
FIG. 5B shows the same for normal paper.
Figure 6A:
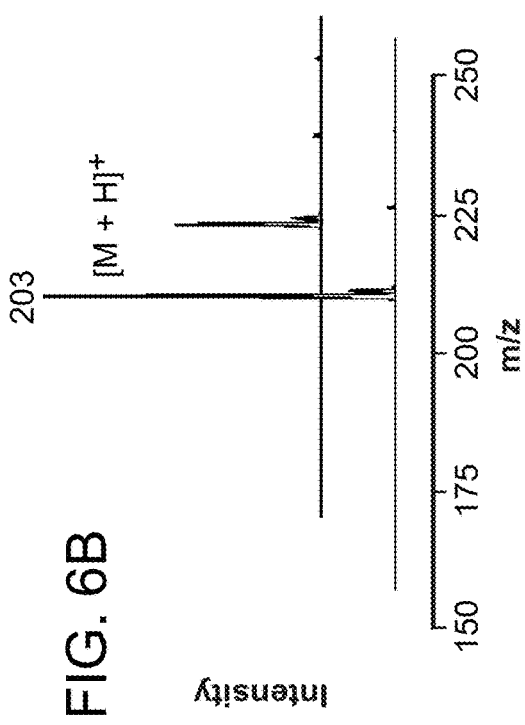
FIGS. 6A-D show intensity enhancement upon the addition of diluted HCl for various analytes (M) at 3 V.
Figure 6B:
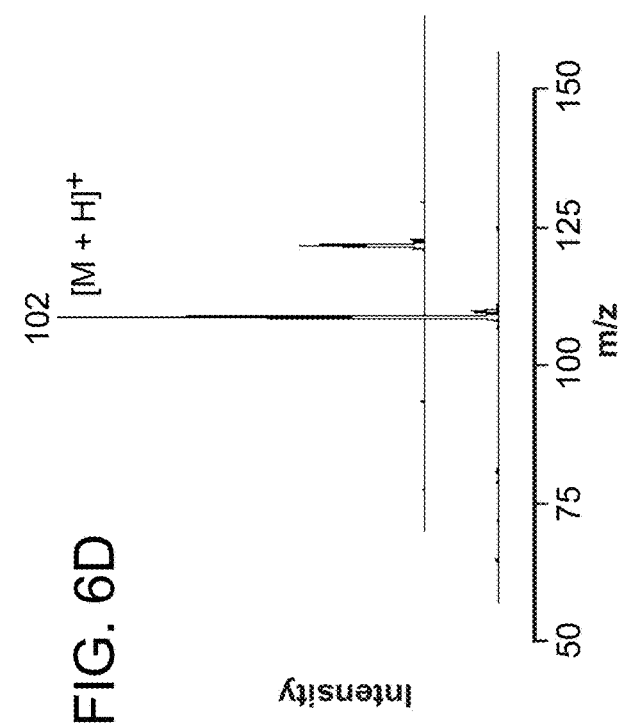
Figure 6C:
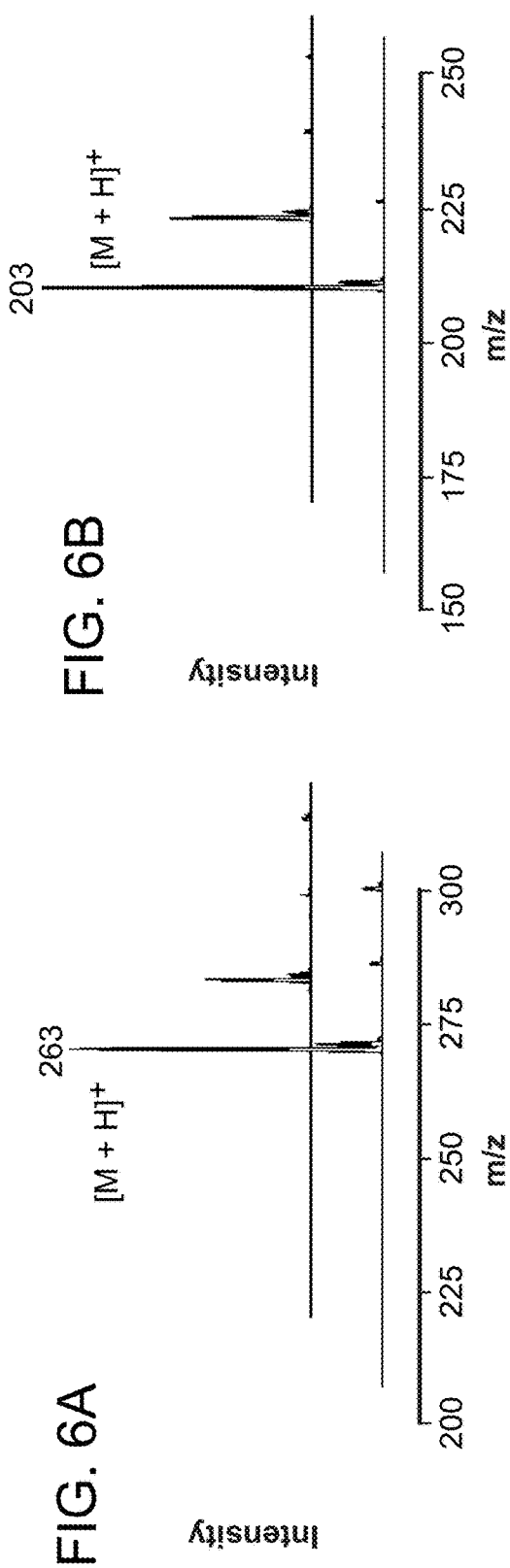
Figure 6D:
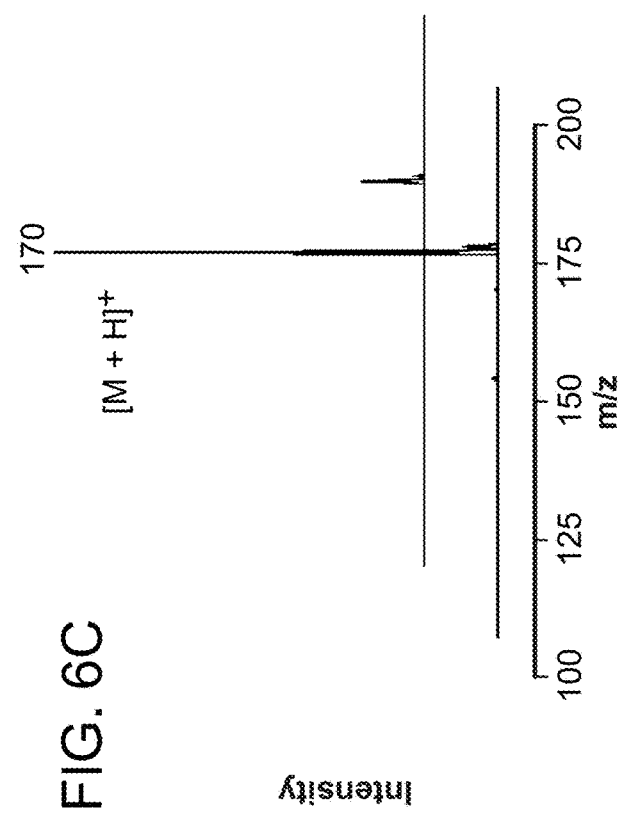
Figure 7A:
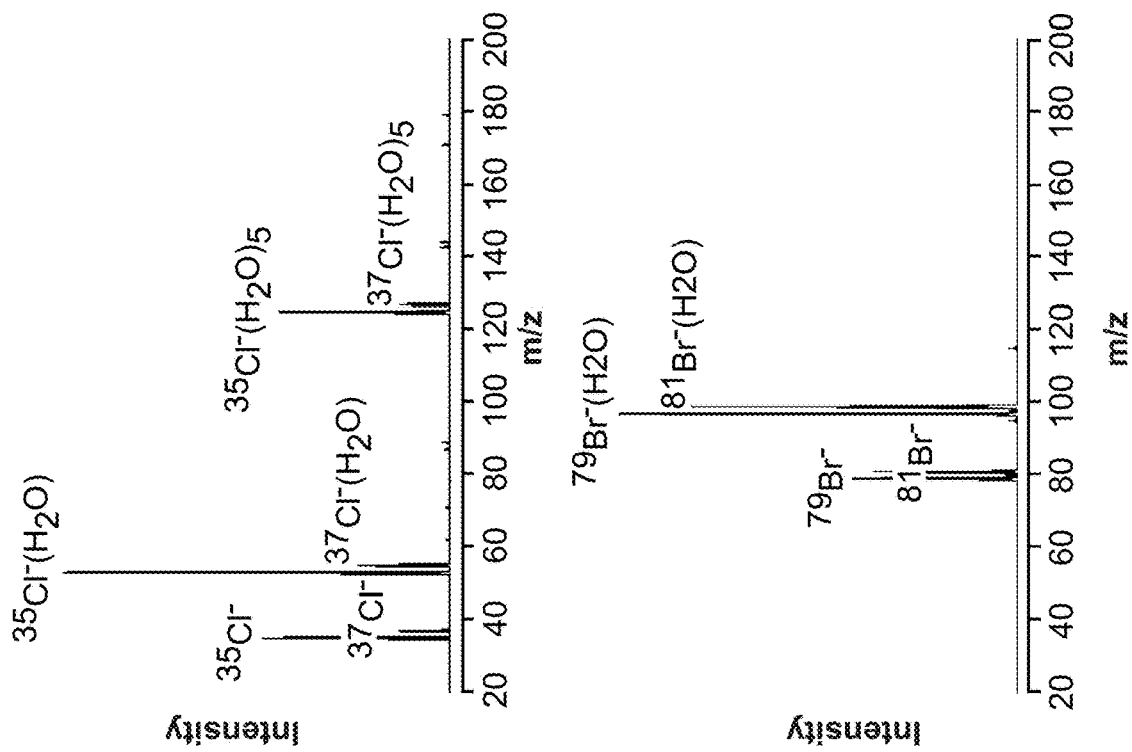
FIGS. 7A-B show analysis of preformed ions (positive and negative ion modes) at 3 V.
Figure 7B:
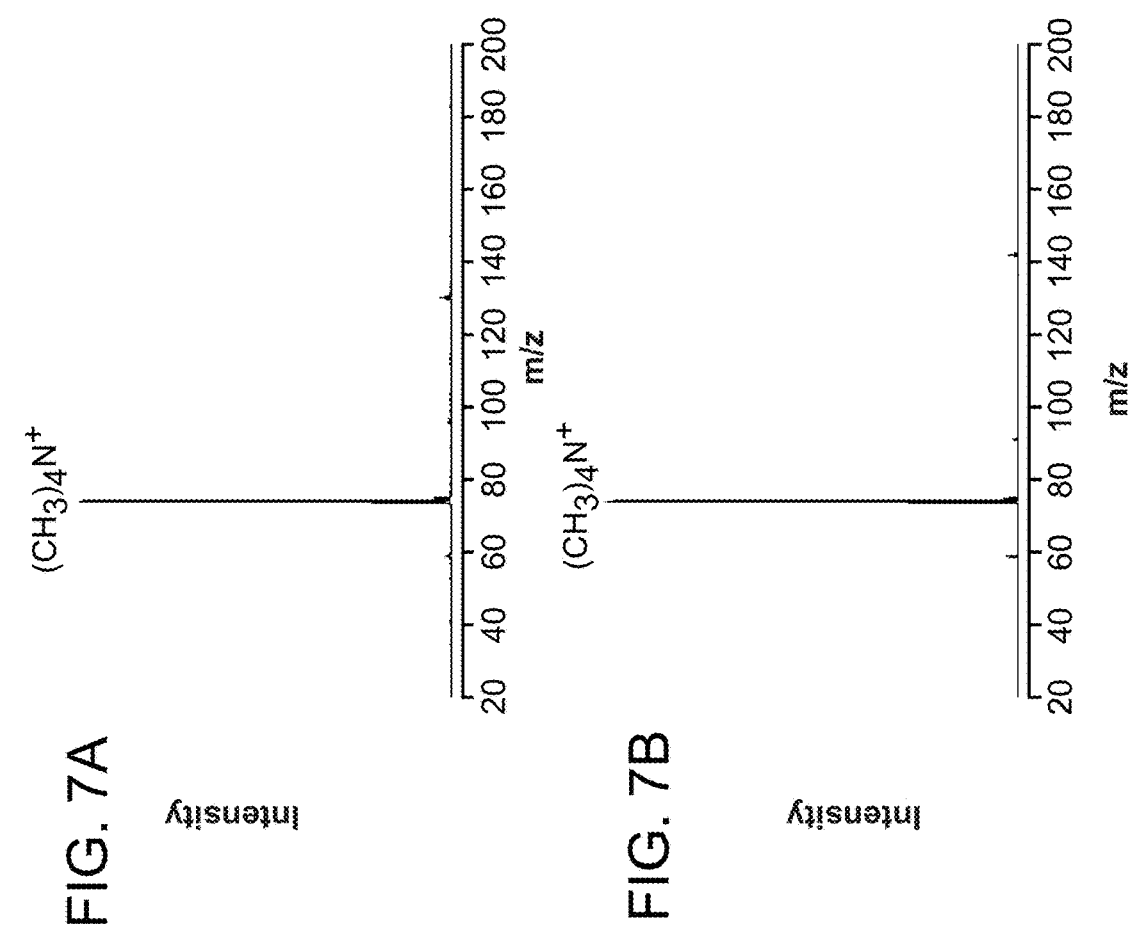

To differentiate the contributions of the protruding CNT structures and macroscopic paper point to ionization, another experiment was done where a rectangular piece of CNT-coated paper was held in front of the mass spectrometer inlet (with one of the long sides facing the MS inlet) and ionization of TPP was attempted. All other parameters except the shape of the paper were held constant. The mass spectra showed (FIG. 4) ionization of TPP at 3 V from this paper rectangle. This proves that there is no involvement in this case of the pointed paper tip but the protruding CNTs are responsible for ionization, revealing the role of nanoscale CNTs in providing a field strength high enough to cause field emission. FIGS. 5A and 5B show the change in intensity of the molecular ion peaks with voltage for CNT-coated and normal paper triangles, respectively. The ion signals for both these papers saturate at high voltages, but with CNTs, the onset of ion ejection is much earlier. Thus from these experiments it is reasonable to conclude that at lower voltages CNTs play a role in ionization and with the increase of voltage a Taylor cone forms at the paper tip is formed and the macroscopic electric field is responsible for ionization.

In conventional field ionization (Luo et al., Chem. Phys. Lett. 2011, 505, 126-129; and Goodsell et al., Arch., Phys. 2010, 1-12), vapor phase molecules placed in a strong electric field lose an electron to form positively charged radical cations. Many of the analytes used are simple volatile organic molecules which if ionized by this mechanism would be expected to give M$^+$ radical cations, e.g. m/z 262 in the case of triphenylphospine, not the observed m/z 263. To test whether field ionization of vapour phase triethylamine might contribute triethylamine (vapor pressure, p=57 torr at 20° C.) was dissolved in acetone (p=184.5 torr at 20° C.) and introduced into the field (the gap between CNTs and MS inlet) as the vapor and ionization was attempted at low voltages. The results showed that analyte vapors do not give detectable ionization. It was concluded that field emission occurs from a solvated analyte or droplet, as in all cases only [M+H]$^+$ and not the radical cation M$^+$. was detected.

To further test the proposed field emission of charged droplet mechanism, the experiment with TPP and three other analytes was repeated in the presence and absence of added protic acid (Cech, C. G. Enke, Mass Spectrom Rev 2001, 20, 362-387). Addition of acid will generate the salt and should inhibit simple field ionization (to give M$^+$) but it should increase the field emission/ionization from droplets (to give M+H)$^+$. For this reason, particular analytes were selected which contain basic functional groups (phosphines and amines) and they were analyzed before and after addition of dilute acid (HCl). FIG. 6 shows enhancement in relative intensity of the protonated molecules after the addition of dilute acid to analytes which contain basic functional groups. This enhancement supports ionization of a solvated species.

Various preformed ions (derived from salts tetramethylammonium chloride, tetramethylammonium bromide, tertramethylammoniun nitrate and tetrabutylammonium iodide) were studied under the same conditions. In accordance with the proposed mechanism, both positive and negative ions were observed in the CNT-derived mass spectra (FIGS. 7A-B and FIGS. 8A-B). No fragmentation was observed and the extreme softness of the process compared even to other soft ionization methods is indicated by the presence of hydrated halide anions. These studies show that preformed ions can also be ejected from the surface in droplets and conventional field ionization is not responsible for ion formation.

Figure 9:
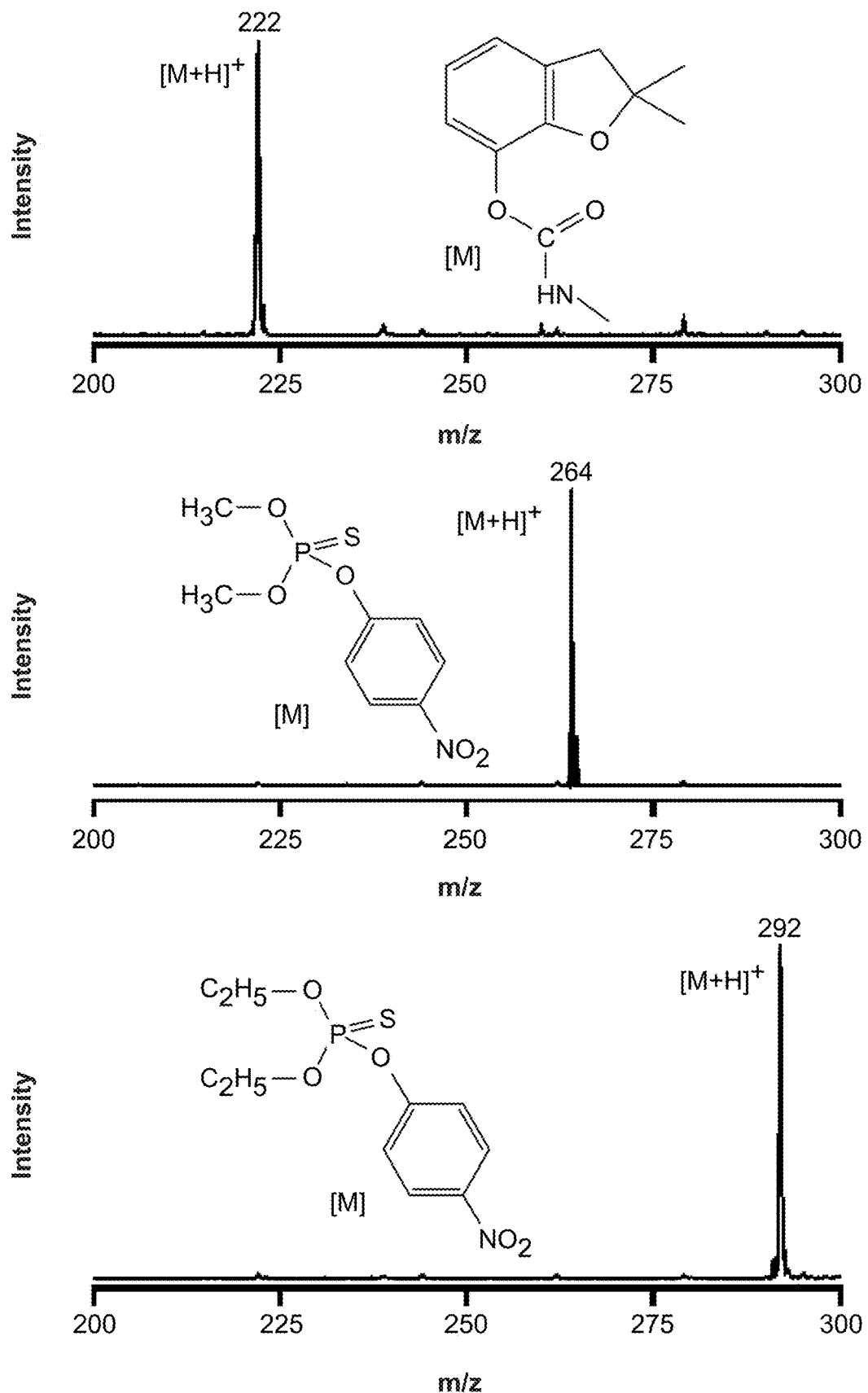
FIG. 9 shows detection of pesticides examined individually from the surface of an orange. Top panel is Carbofuran. Middle panel is methyl parathion. Bottom panel is parathion.
Figure 10:
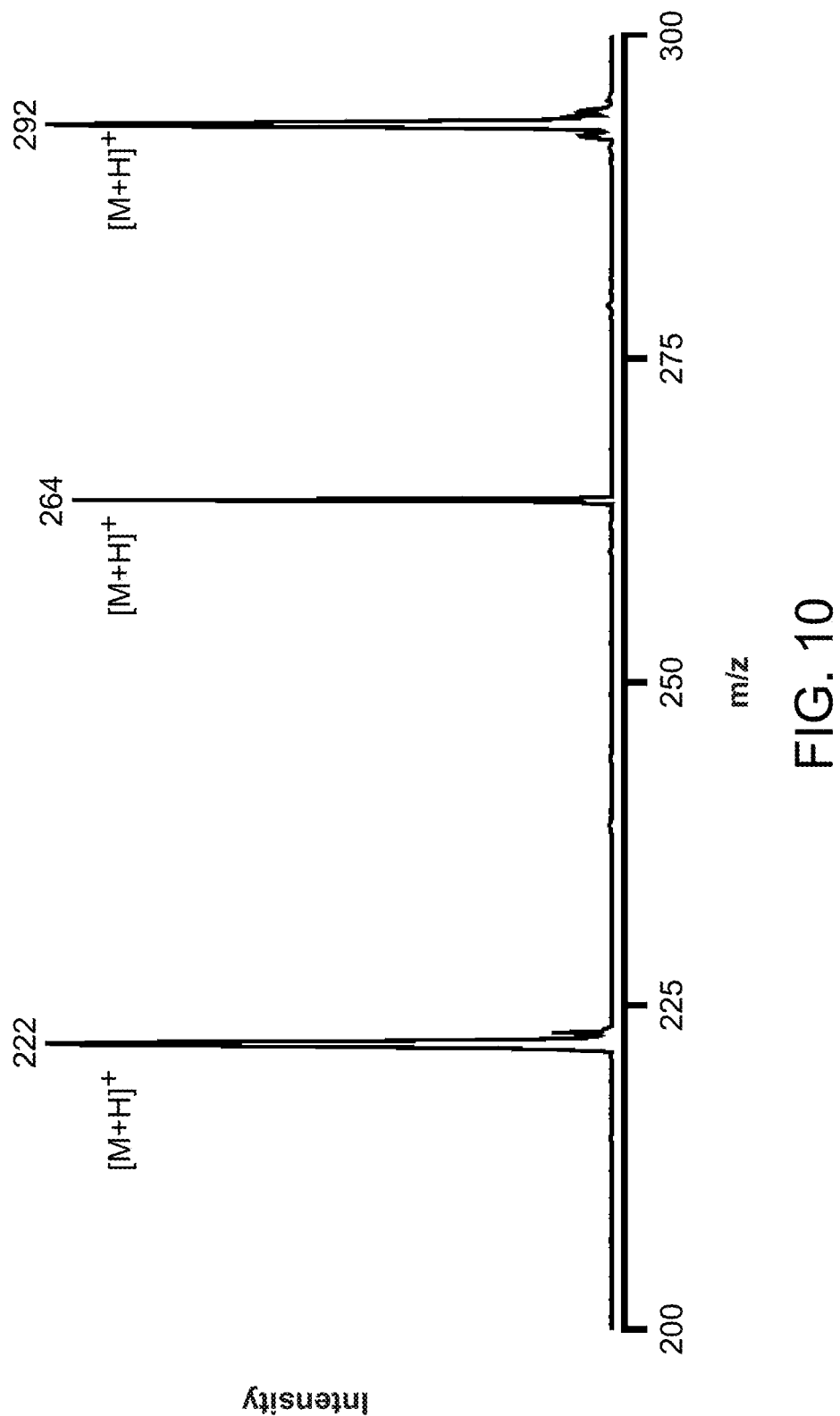
FIG. 10 shows analysis of a pesticide mixture at 3 V from the surface of an orange. Isotopic distribution of the peaks is not clearly visible due to low intensity.

To further characterize the CNT-ionization technique, it was employed for qualitative analysis of various analytes including pesticides, antibiotics and amino acids. All gave characteristic mass spectra; hence this low voltage ionization methodology is shown to be useful for diverse analytical needs. Direct analysis of various contaminants on fruits is possible with this methodology. Three common insecticides (carbofuran, methyl parathion and parathion) used for the protection of fruits were applied on the surface of an orange at 50 ppm concentration. Then CNT-coated paper was rubbed on the surface and held in front of the MS inlet for analysis. FIG. 9 show molecular ion peaks of different pesticides using the battery powered spray MS method. It is possible that the amount of sample extracted from the fruit surfaces during rubbing may be several orders of magnitude lower than the applied quantity, so the limit of detection may be much lower than the applied sample concentration. FIG. 10 shows the molecular ion peaks of each of these pesticides from their mixture.

Figure 11A:
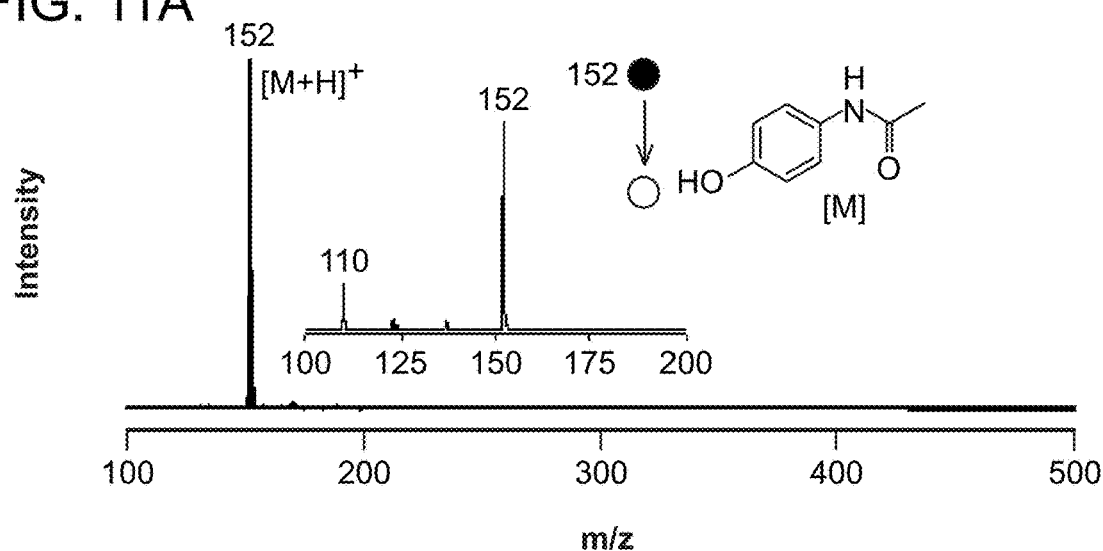
FIGS. 11A-C show analysis of tablets from CNT-coated paper at 3 V with their mass spectral and MS$^2$ data.
Figure 11B:
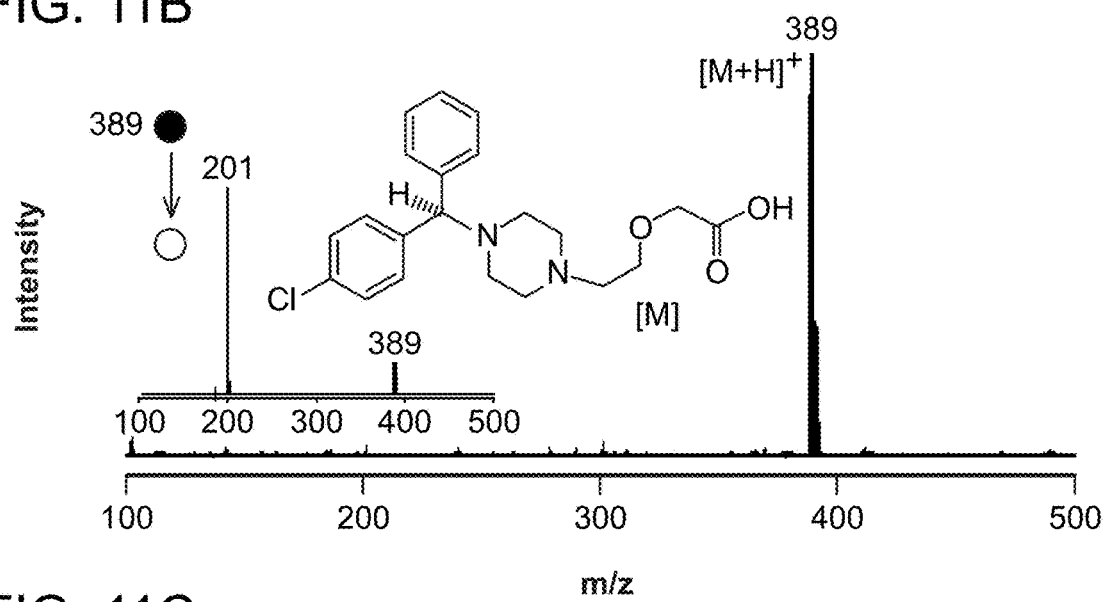
Figure 11C:
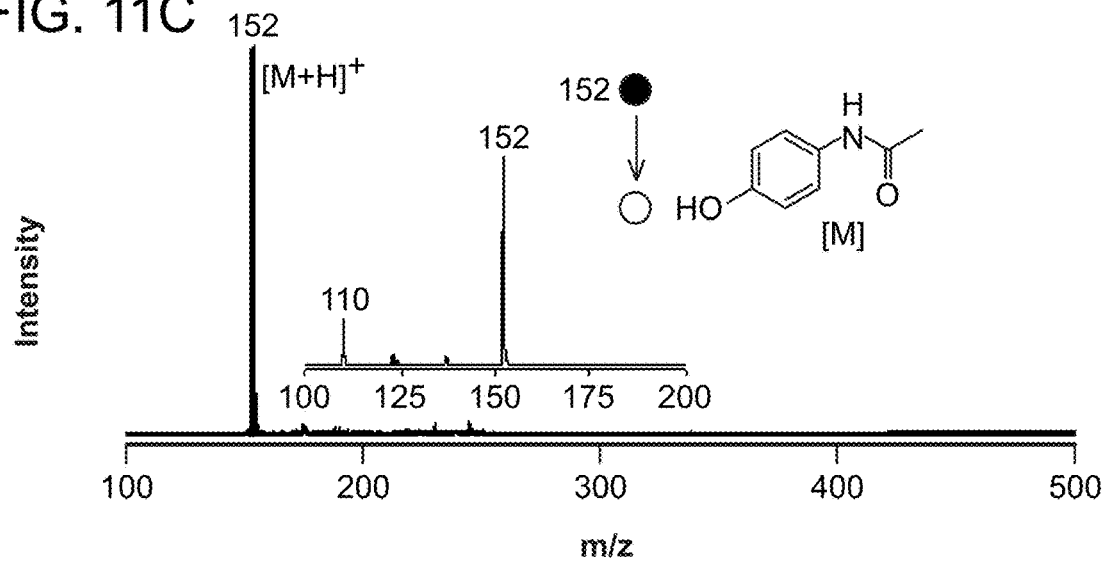
Figure 12E:
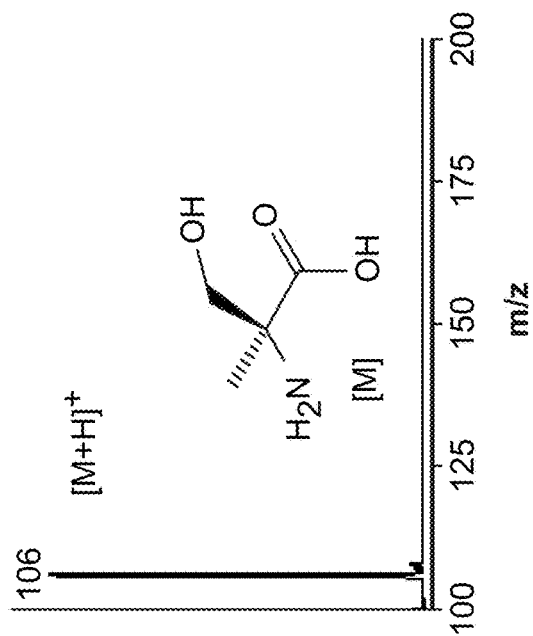
Figure 12F:
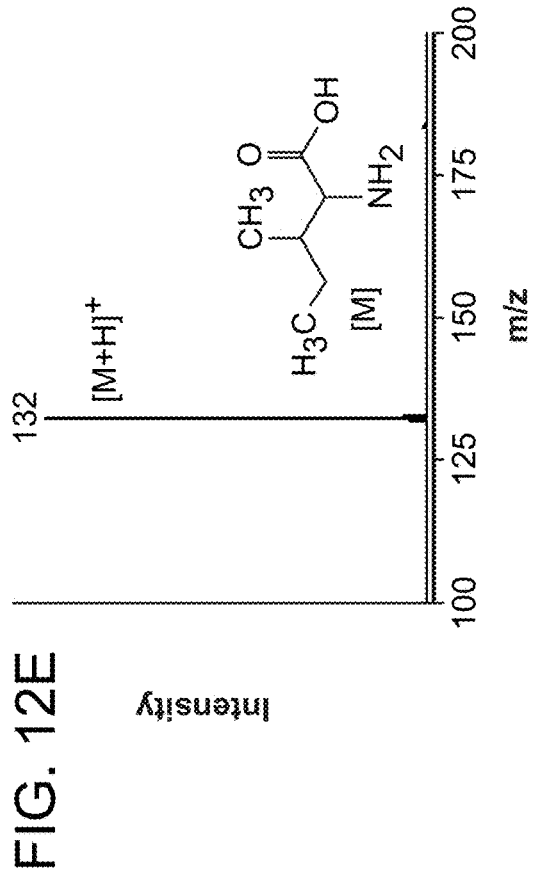
Figure 12G:
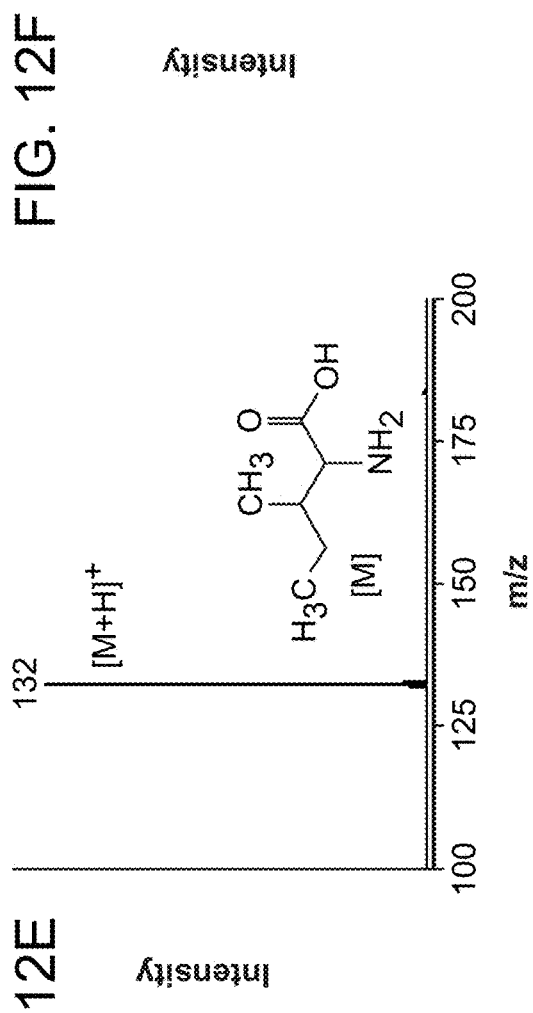
Figure 12H:
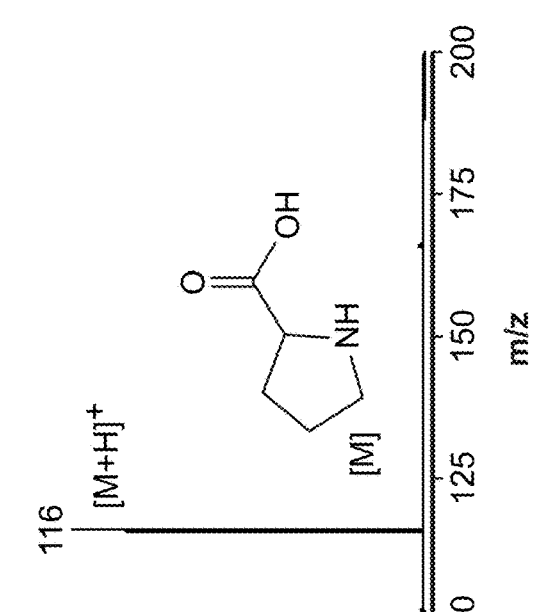

The same methodology was used to analyze medicines. CNT-coated paper was rubbed on the surfaces of three commercially available medicinal tablets, viz. crocin, combiflam and xyzal (trade names) and held in front of a MS inlet with the 3 V battery set-up. FIGS. 11A-C show that both crocin and combiflam contain paracetamol (acetaminophen) as the major ingredient. Direct analysis of these tablets using CNT-coated paper gave a peak corresponding to protonated paracetamol. The other tablet, xyzal is a non-sedative antihistamine and contains levocetrizine dihydrochloride as the active ingredient. Analysis of this tablet (FIG. 11B) under the same conditions gave protonated levocetricine. The identity of the analytes was confirmed by $MS^2$ studies (data shown in the insets).

Direct analysis of amino acids is also possible by spraying from CNT-coated paper.

Several amino acids (30 ppm) were dropped onto the tip of the CNT-coated paper with a micropipette (injected volume 3 µL, corresponding to a total loading of 10 ng). FIGS. 12A-H show intense protonated molecular peaks of the amino acids. The zwitterionic nature of amino acids may lead to easy extraction of ions from the nanotube tips in the electric field.

Figure 13A:
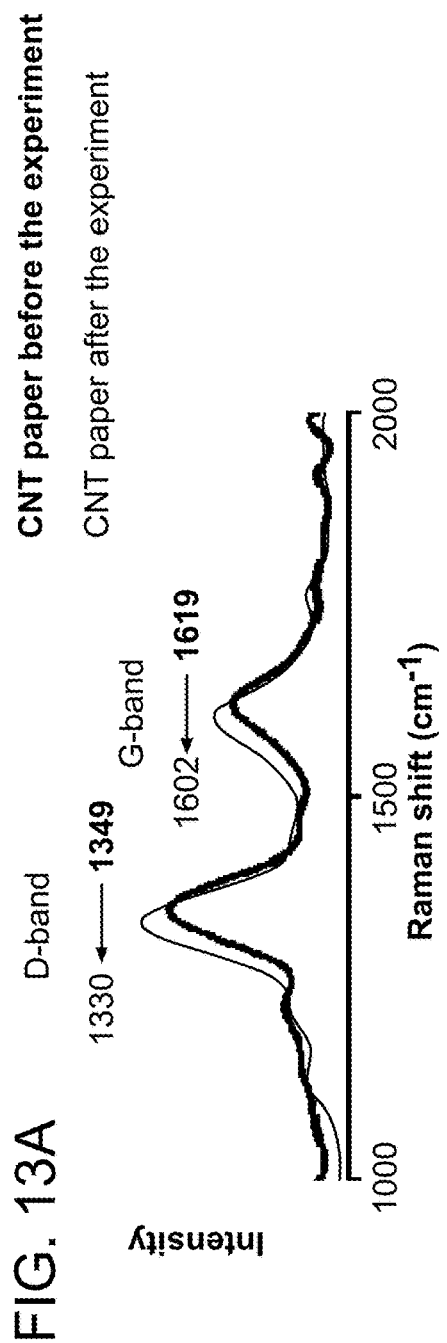
FIGS. 13A-C show Raman measurement of CNT-coated paper before and after ionization.

In order to probe the effect of the ionization event on the paper electrode itself, Raman spectra of CNT-coated paper were recorded before and after a series of experiments (ionization of TPP at 3 V over a period of 20 minutes) (FIG. 13A). See Costa et al., Mater. Sci.-Pol. 2008, 26, 433-441; and Naeemi et al., Annu. Rev. Mater. Res. 2009, 39, 255-275. The data show a large red shift (Lee et al., J. Phys. Chem. Solids 2011, 72, 1101-1103; and Bhalerao et al., Phys. Rev. B: Condens. Matter Mater. Phys. 2012, 86) in the D and G bands which implies the acquisition of electrons in the CNT during positive mode ionization (Scheibe et al., Mater. Charact. 2010, 61, 185-191). It appears that as ionization occurs, charge builds up as would be expected for a field-assisted ionization (Luo et al., Chem. Phys. Lett. 2011, 505, 126-129; and Goodsell et al., Arch., Phys. 2010, 1-12). However, there appears to be electron transfer from the developing microdroplet to the CNT; effectively a polarization of the electrons in the long thin CNT fiber (see FIG. 1D) driven by the high field and mobility of electrons in the CNTs and its large electron affinity (Shamsipur et al., Electroanalysis 2012, 24, 357-367). As the positively charged droplet breaks away, the residual charge appears to lead to reduction of CNTs as reflected in the Raman spectrum as red-shifted D and G bands. This speculation on electron transfer from the charged microdroplet of solvent to CNT was supported by a blank experiment, where only solvent and potential were applied to CNT-coated paper for the same period of time and Raman measurement was performed. The spectrum showed red shifts in D and G bands.

Figure 13B:
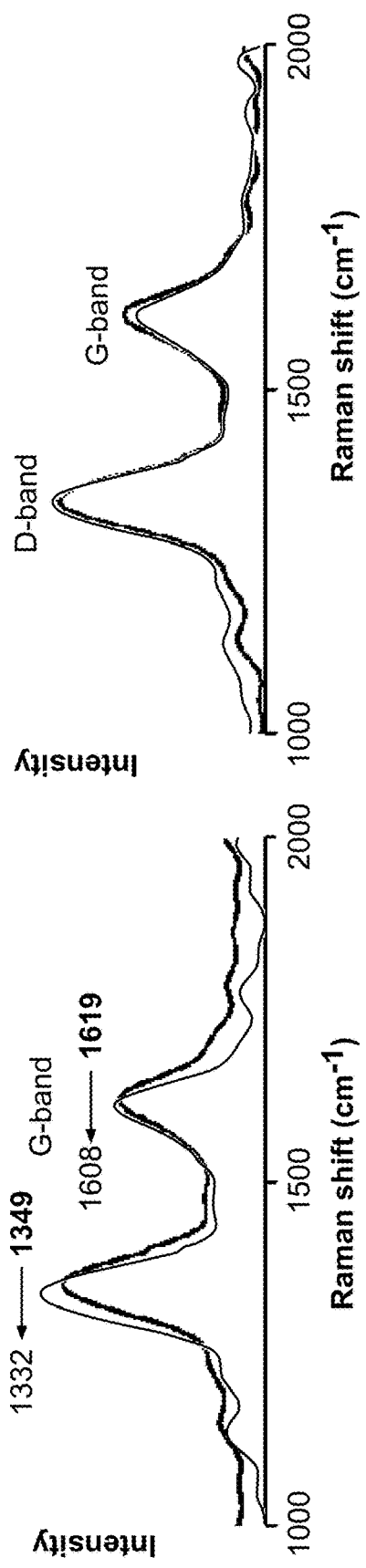
Figure 13C:
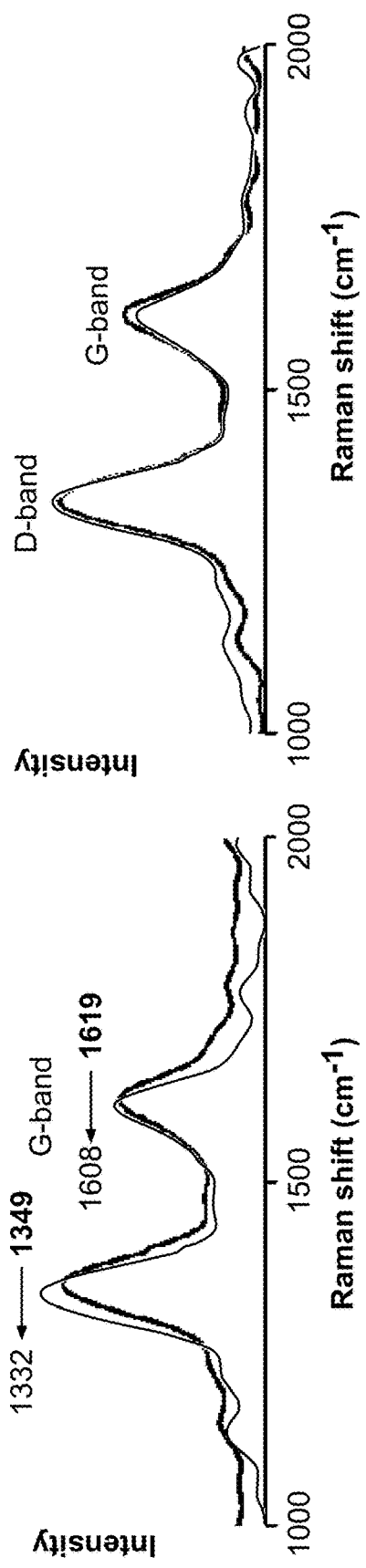

The Raman spectra of the nanotube sample were also recorded before and after ionization of the salt tetramethylammonium bromide in both the positive and negative ion modes. FIG. 13B shows a red shift of D and G bands for CNT-coated paper in case of the positive ion mode measurement. This may be due as before to the high electric field needed to cause solvated ion ejection in microdroplets. There was no such reduction for the negative ion mode measurement as Raman measurements show unshifted D and G bands, (FIG. 13C) presumably because the CNTs are already electron-rich in this condition and the field replenishes the charge lost.

The results presented here suggest a versatile strategy for the direct analysis of diverse chemical species. The methodology can be modified to suit various analytical requirements. Replacement of the high voltage power supply with a 3V battery simplifies mass spectrometry through ion formation from a nanoscale antenna. The CNT ionization method has been applied to a variety of samples from different sources including fruit surfaces, medical tablets, and a range of organic molecules, including amino acids, antibiotics and pesticides, at relatively low concentrations.

Example 3

Sample Analysis Using Probes of the Invention Using a 1V Power Source

Low voltage (1 V) ionization using carbon nanotubes has been extended to detect various fragile species. These include a variety of acid dimers as well as hydrates of different anionic species. These fragile species are characterized by their low internal energy so that it can be easily detected at low voltage, where fragmentation is negligible.

Five different acids from formic acid to pentanoic acid have been detected in negative mode and the spectra are shown in FIGS. 15A-E. Each spectrum is characterized by the presence of a proton bound dimer along with the molecular ion peak. Another finding was the detection of mixed dimers at low voltage. Here various acid combinations were made and were analyzed at low voltage of 1V. The results are demonstrated in FIGS. 16A-D. Here, a variety of mixed dimers were seen along with the expected individual acid dimers.

Figure 18:
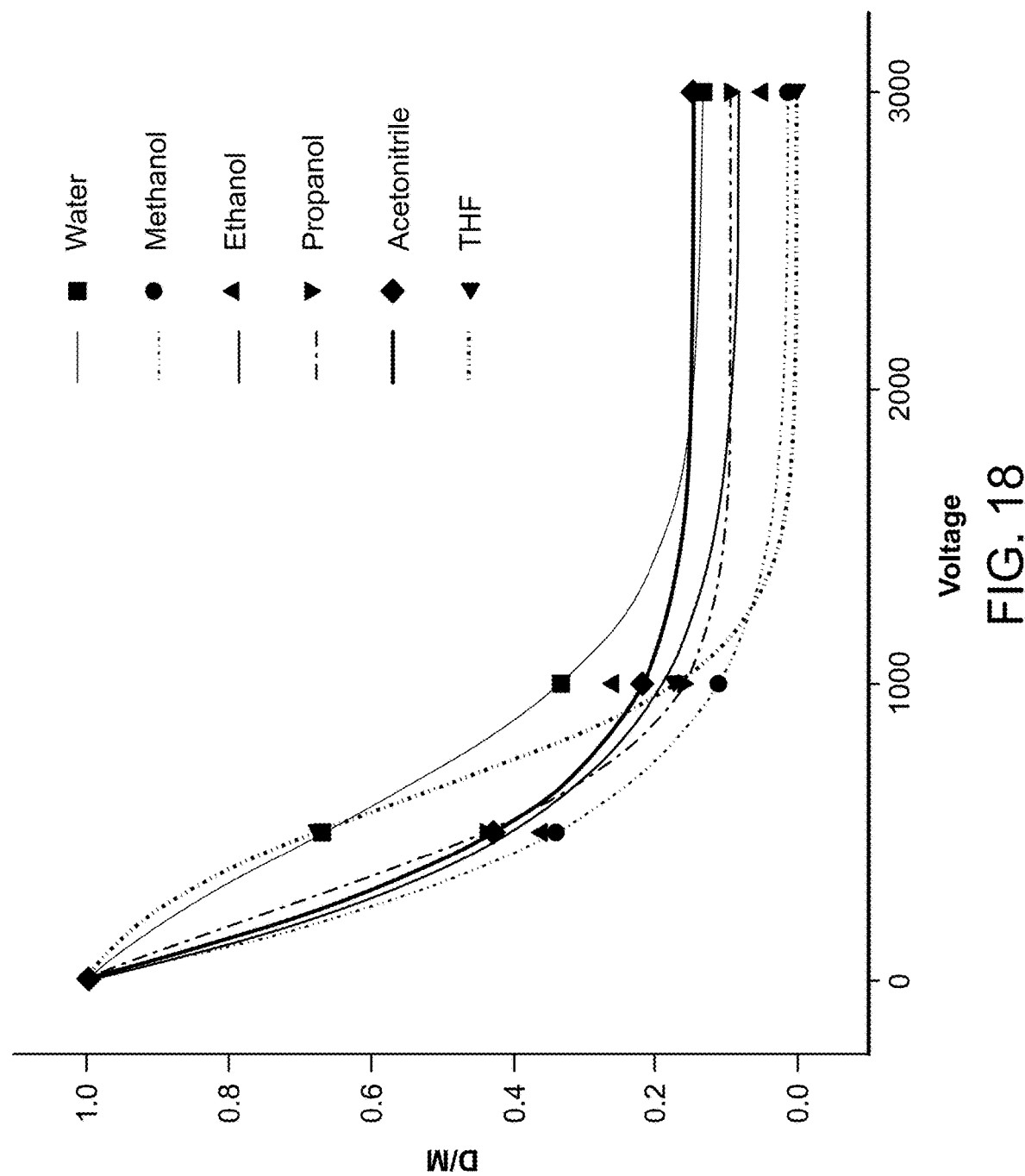
FIG. 18 shows D/M ratio vs voltage for propionic acid in different solvents.
Figure 19B:
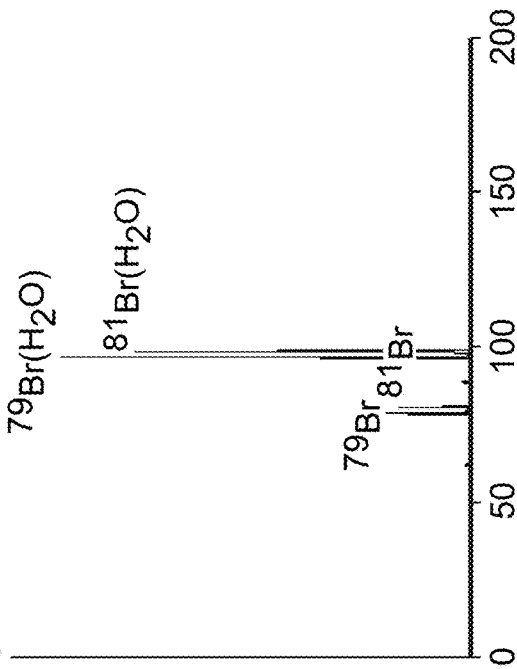
FIGS. 19A-D show detection hydrates of various anions at 1V.
Figure 19D:
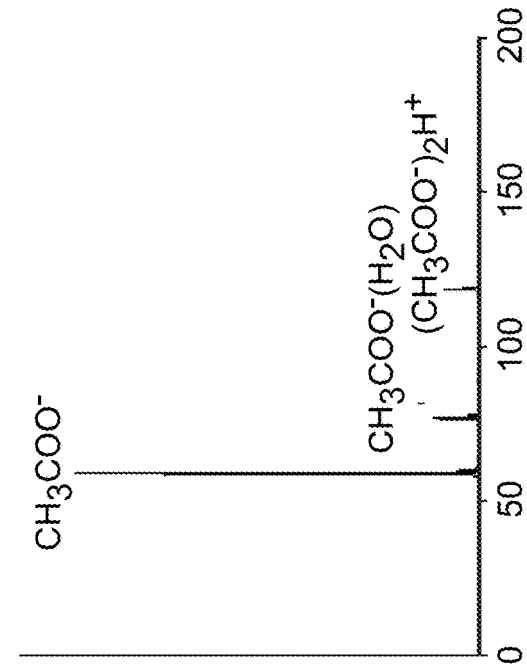
Figure 19A:
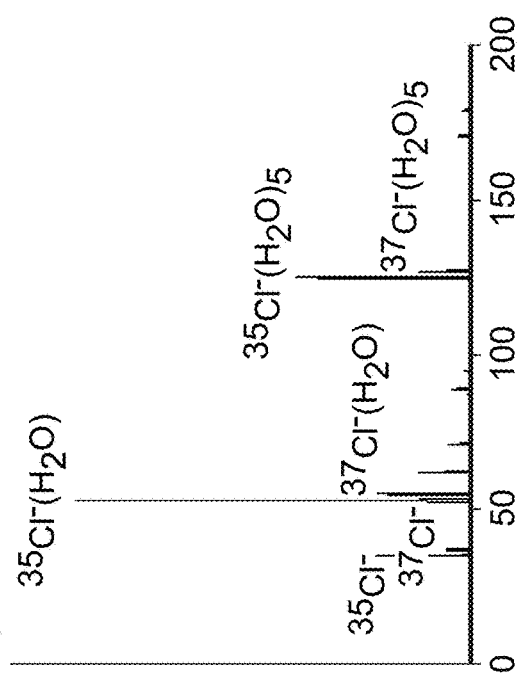
Figure 19C:
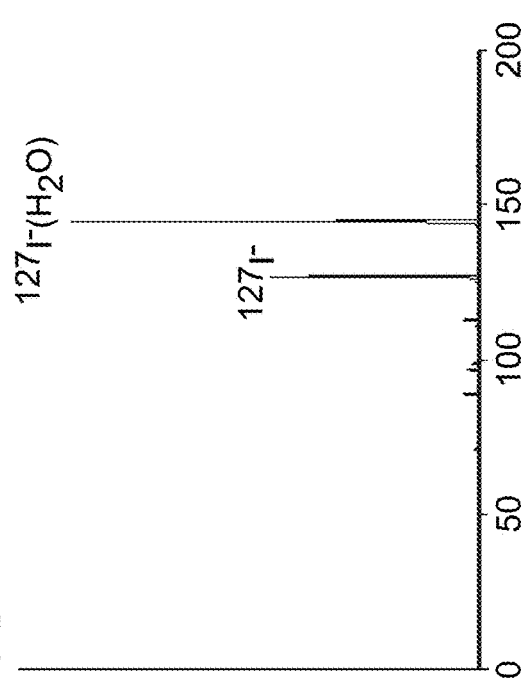
Figure 20:
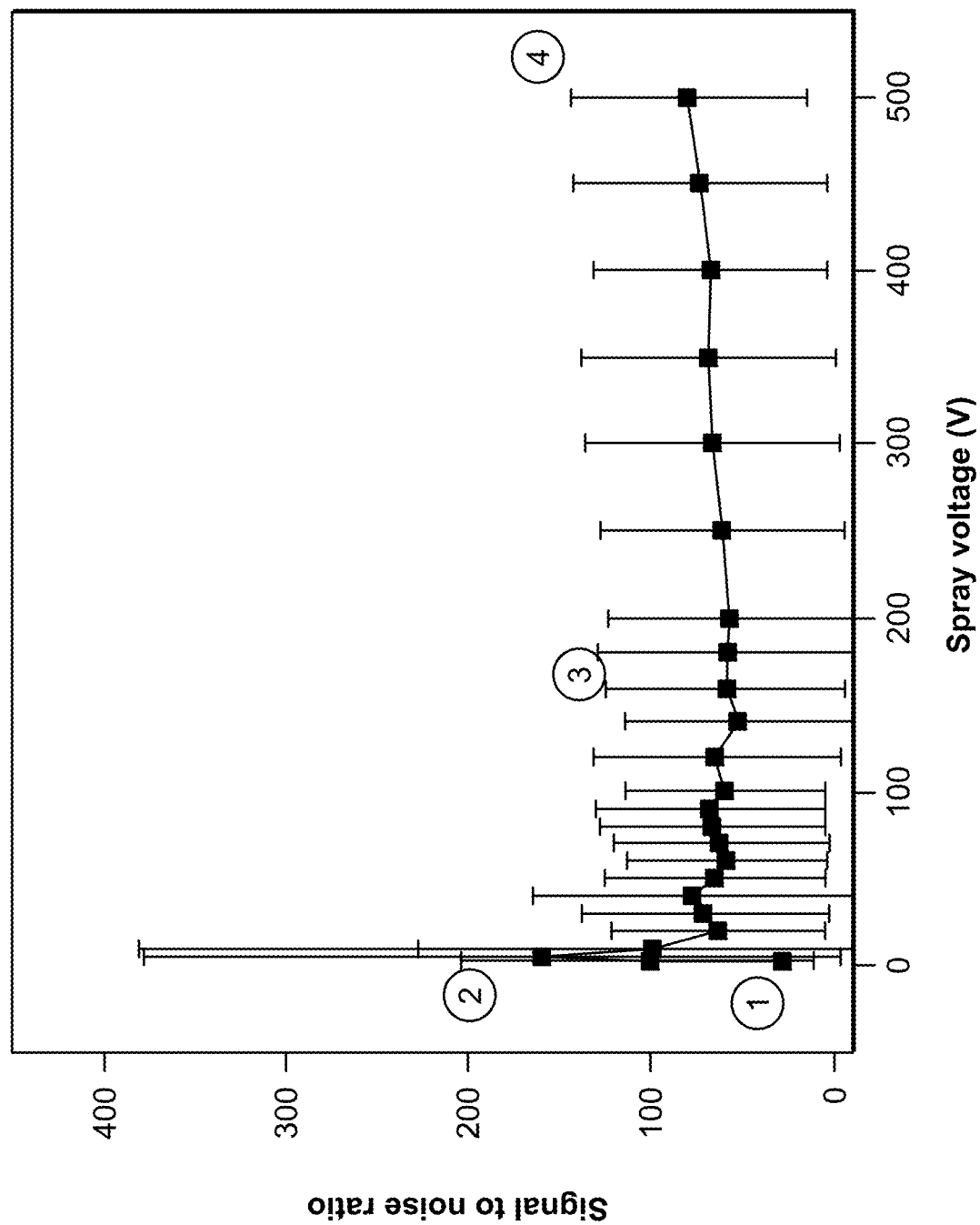
FIG. 20 is a plot of signal to noise ratio (S/N) with respect to spray voltage for the low voltage spray mass spectrometry (CNT coated paper spray) using 50 ppm triphenylphosphine solution as test analyte. This spray was conducted by delivery of 5 μL of analyte solution onto the tip for each experiment. The CNT coated paper tip was positioned approximately 1 mm away from the MS inlet.
Figure 21:
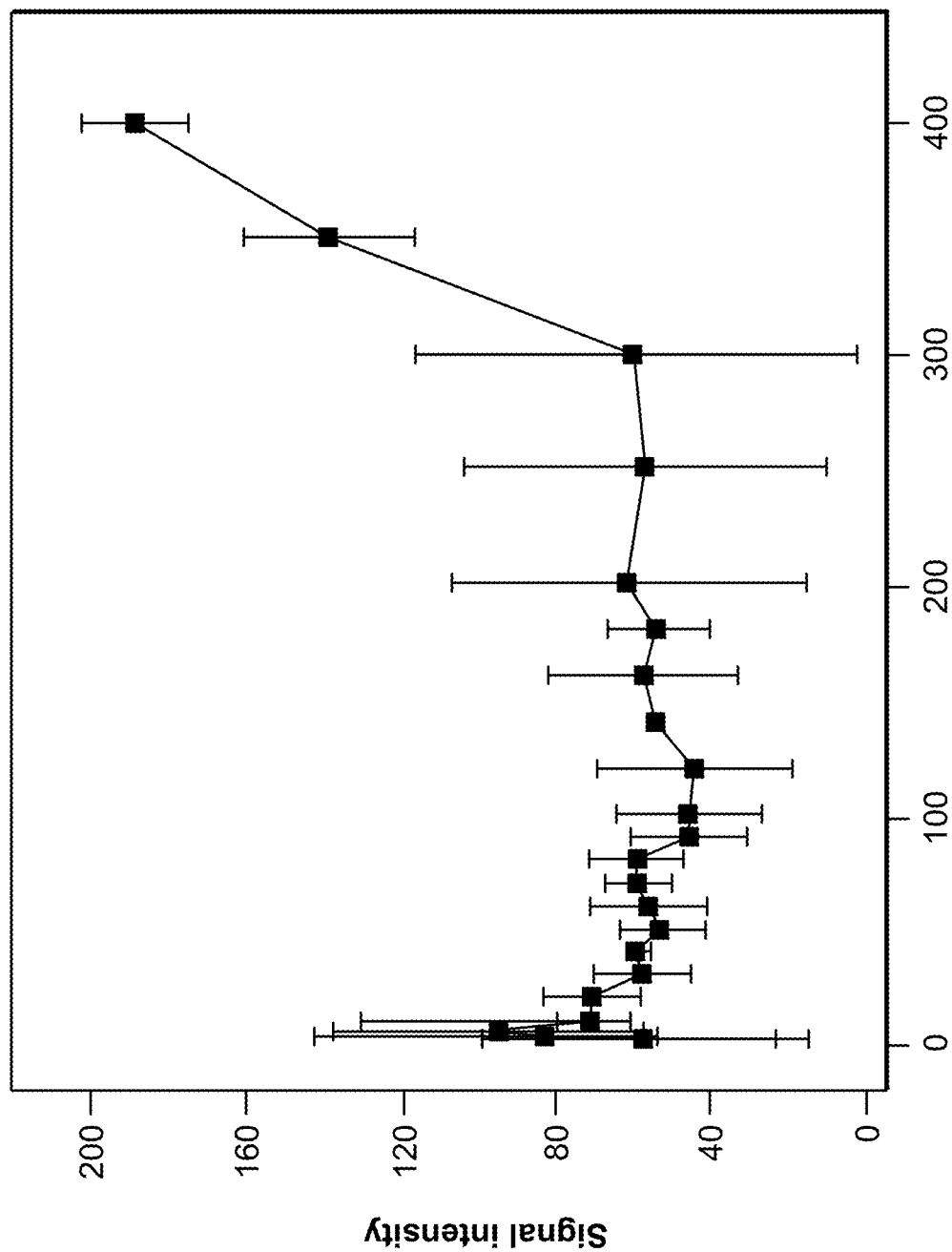
FIG. 21 is a Plot of signal intensity with respect to spray voltage for the low voltage spray mass spectrometry (CNT coated paper spray) using 50 ppm triphenylphosphine solution in methanol as test analyte; rectangular CNT paper spray, capillary and tube lens voltages 0 V, distance from MS inlet ~0.5 mm, average of 5 experiments.
Figure 22A:
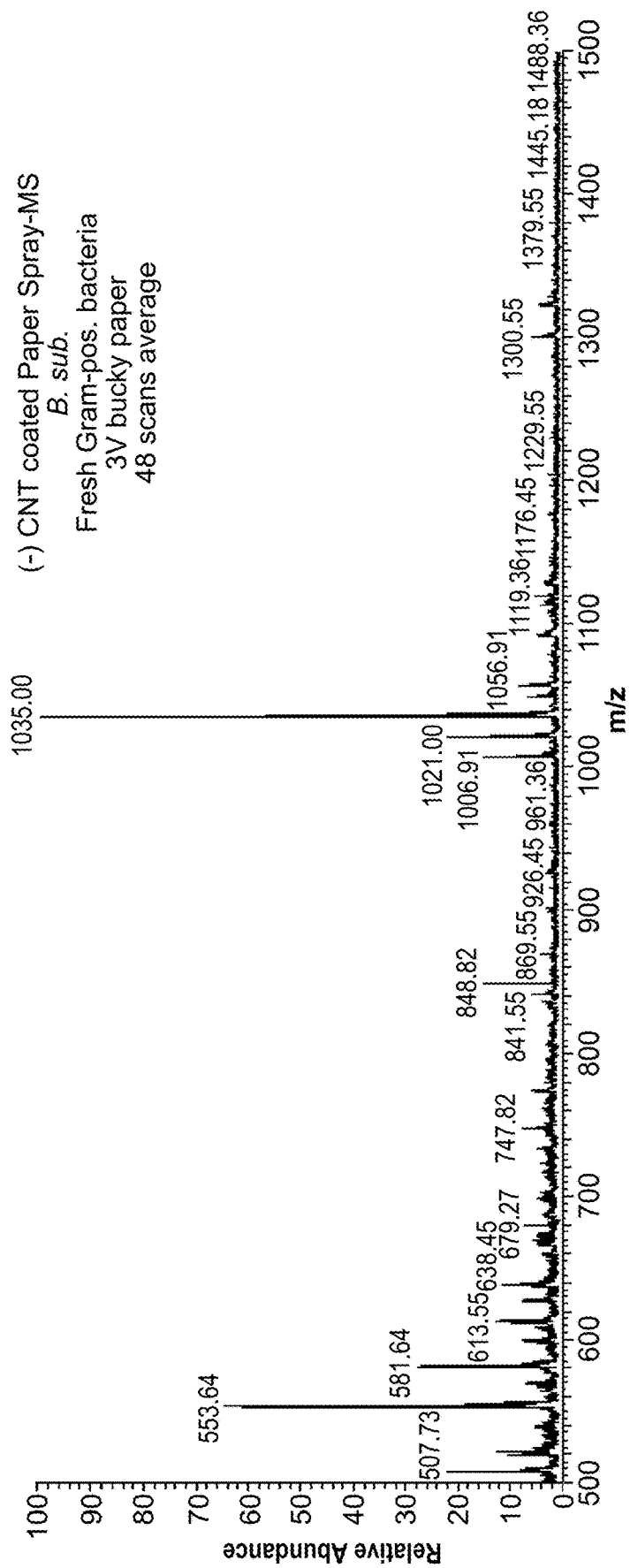
FIGS. 22A-B show negative mode mass spectra obtained from *Bacillus subtilis* using CNT paper spray mass spectrometry at 3 V (top) and paper spray mass spectrometry at 3.5 kV (below). Spray solvent (methanol, 10 μL) was added to few colonies smeared to the paper rectangle.
Figure 22B:
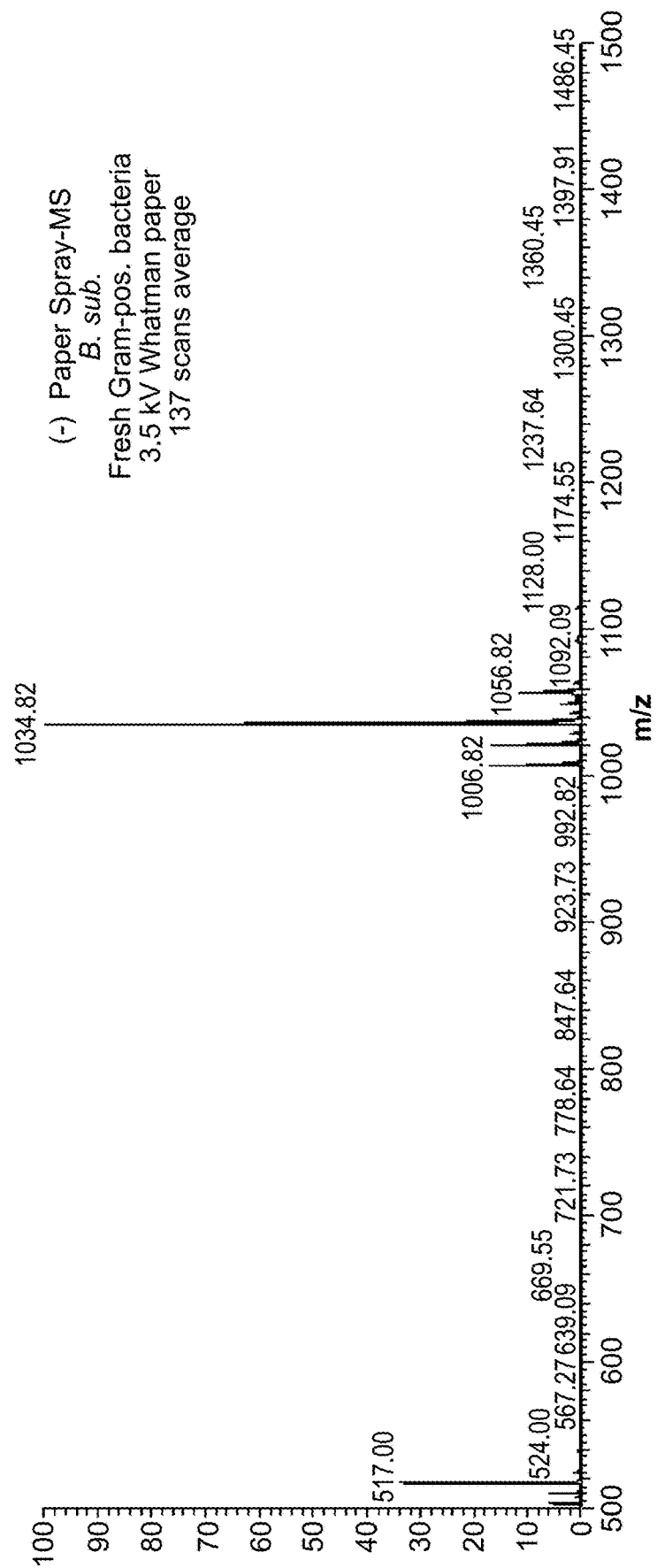

The variation of intensity of these acid dimers with voltage (D/M ratio vs voltage) has been tested and the results show a gradual decrease in the intensity of acid dimers as we go to very high voltages. FIGS. 17A-B represent the results, where D/M ratio has been plotted as a function of voltage for five different acids in two different solvents (water and methanol). Similar study was carried out on a single acid in different solvents also. Here propionic acid was taken in different solvents and the D/M ratio was noted for a range of voltage from 1 V to 3 kV. Result is shown in FIG. 18.

Another set of study was carried out at low voltage (1V) on different anionic species where the aim was to detect various hydrates of anions. The results are shown in FIGS. 19A-D. The results show the presence of various hydrates of different anionic species from chloride to acetate.

Example 4

Spray Formation

This Example investigates the mechanism of low voltage spray. In order to establish the mechanism of this spray two pathways were taken, e.g., study of changing signal to noise ratio upon increasing low voltage to moderately high voltage (500 V), secondly, by capturing video during the spray. Besides these work, some effort was given on computational study to support the work. It is proposed that several mechanisms may be responsible (operating independently or collectively) to give rise to signal at very low voltage. Detection of microorganisms at low voltage is shown as an application of this method.

In order to understand the mechanism, a few experiments were performed. Analytes, such as, triphenylphosphine (PPh$_3$), tricyclohexylphosphine, dibutylamine, tributylamine were utilized in the experiments. One such example is given below.

In an experiment, 5 µL 50 ppm PPh$_3$ was sprayed into the mass spectrometer. The spray voltages were varied from 2 V to 500 V. This investigation was stopped at 500 V for two reasons. Firstly, to avoid any discharge arising from the CNT coated paper tip. Secondly, above 500 V spray voltage, the signal intensity increased rapidly and was reaching values comparable to normal paper spray.

The tip was held at a separation ~0.5 mm from mass spec inlet. Spectra were collected and analyzed and the signal to noise ratio (S/N) and signal intensity with respect to increasing spray voltage was plotted (FIGS. 20 and 21). The distribution is divided in four regions. Region 1, 2 V spray where the analysis was commenced, no signal. Upon increasing the spray voltage to 3, 4 or 5 V, the S/N ratio shows rapid increase (region 2). Region 3, 8-500 V, the S/N ratio is at steady state. Beyond 500 V (region 4) the signal/noise rises rapidly but is not shown as it tends towards normal paper spray values. After 500 V, the signal increases to two or three orders of magnitude compared to low voltage spray so normal paper spray (PS) comes into play at this voltage.

The appearance of analyte signal is controlled by two factors, field emission and field-induced transport of the ionized molecule (in a thin film of solution) to the high field (emitter) areas of the substrate. A hypothesis is that at very low voltage (Region 1) the small number of molecules already in place at high field spots are ionized by field emission, presumably in microdroplets. This requires a limited voltage in combination with the small physical dimensions (order of 1 nm). So 5 V at 1 nm gives a field strength of $5\times10^9$ V/m which is just in the range of field emission (Beckey, Field Ionization Mass Spectrometry, Pergamon, London, 1971). Region 2 (5-300 V) is approximately a steady state region in terms of S/N ratio in terms of signal there are two sub-regions, 5-100 V where the signal falls and 100-300 V where it rises slightly. These data mean that either the field emission is slow, and rate limiting, or the field induced transport is slow. One expects an increase in field emission with voltage (if for no other reason than the fact that the area in which the field strength exceeds that needed for ion formation is increasing). However, if transport is not effective, this signal can fall with increasing voltage because of prior removal of material from the higher field areas. It is proposed that the transport of material related to $PPh_3$ only becomes effective around 100 V. The break at 300 V might be due to different mechanisms of transport, such as solution phase vs. thin film or conversion to an ion here and very effective transport.

Example 5

Microorganism Analysis Using Probes of the Invention

For microorganisms, the bacteria isolates, supplied by bioMérieux, Inc. (Hazelwood, Mo.) were cultured from frozen samples stored at −80° C. on TSAB in cryotubes. All experiments were performed under Institutional Review Board guidelines IBC protocol #07-004-10 "Novel tissue, Biological fluid and Bacteria Evaluation by Mass Spectrometry" as amended. Five types of microorganisms were used in the present study, which are *Escherichia coli* (Gram-negative bacteria), *Citrobacter farmeri* (Gram-negative bacteria), *Staphylococcus aureus* (Gram-positive bacteria), *Bacillus subtilis* (Gram-positive bacteria), *Saccharomyces cerevisiae* (yeast). These common microorganisms are chosen due to their widespread presence throughout the biosphere.

Microorganism samples (*Bacillus subtilis* in this case) were analyzed using CNT spray and paper spray. *Bacillus subtilis* can be detected using low voltage spray using CNT coated paper and their mass spectra are comparable (FIGS. 22A-B) to traditional paper spray. However, at 3 V, the mass spectra intensity is usually three orders of magnitude less intense than normal paper spray signal (FIG. 22B). Reproducibility was tested by analyzing *Citrobacter fameri* seven times. In each mass spectrum a similar relative abundances of lipids was obtained.

What is claimed is:

1. A method for analyzing a biological molecule, the method comprising:

providing a mass spectrometry probe comprising a paper substrate in which a portion of the paper substrate is coated with an electrically conductive material that is not a biological molecule or a solvent, in a manner that a plurality of nanoscale features protrude from the paper substrate, the plurality of nanoscale features configured to act as a plurality of electrodes and upon application of a voltage of 3 volts or less, providing a field strength high enough to cause field emission of microscale solution droplets at the plurality of nanoscale features at a voltage that does not cause fragmentation of the biological molecule; connecting the mass spectrometry probe to a voltage source, wherein the voltage source is configured to generate a voltage of 3 volts or less; contacting the mass spectrometry probe with the biological molecule; ionizing the biological molecule that has contacted the mass spectrometry probe; and analyzing the ionized biological molecule in a mass spectrometer.

2. The method according to claim 1, wherein the electrically conductive material comprises one or more electrically conductive nanotubes.

3. The method according to claim 2, wherein the electrically conductive nanotubes are carbon nanotubes.

4. The method according to claim 3, wherein the carbon nanotubes coat an external surface of the paper substrate.

5. The method according to claim 1, wherein prior to the ionizing step, the method further comprises applying the solvent to the mass spectrometry probe.

6. The method according to claim 5, wherein the solvent is continuously supplied to the mass spectrometry probe.

7. The method according to claim 5, wherein the mass spectrometry probe is separate from the solvent.

8. The method according to claim 5, wherein the solvent assists in at least one of separation, extraction, and ionization of the biological molecule.

9. The method according to claim 1, wherein pneumatic assistance is not required to transport the biological molecule through the mass spectrometry probe.

10. The method according to claim 1, wherein the paper is filter paper.

11. A method for analyzing a sample, the method comprising: providing a mass spectrometry probe comprising a paper substrate and a plurality of carbon nanotubes, the mass spectrometry probe configured such that a portion of each of the plurality of carbon nanotubes protrudes from the paper substrate forming a plurality of nanoscale features that extend from the paper substrate, the plurality of nanoscale features configured to act as a plurality of electrodes and upon application of a voltage of 3 volts or less, providing a filed strength high enough to cause field emission of microscale solution droplets at a voltage that does not cause fragmentation of a biological molecule; connecting the mass spectrometry probe to a voltage source, wherein the voltage source is configured to generate a voltage of 3 volts or less; contacting the mass spectrometry probe with the biological molecule; ionizing the biological molecule that has contacted the mass spectrometry probe; and analyzing the ionized biological molecule in a mass spectrometer.

12. The method according to claim 11, wherein the carbon nanotubes coat an external surface of the paper substrate.

13. The method according to claim 11, wherein prior to the ionizing step, the method further comprises applying a solvent to the mass spectrometry probe.

14. The method according to claim 13, wherein the solvent is continuously supplied to the mass spectrometry probe.

15. The method according to claim 13, wherein the mass spectrometry probe is separate from the solvent.

16. The method according to claim 13, wherein the solvent assists in at least one of separation, extraction, and ionization of the biological molecule.

17. The method according to claim 11, wherein pneumatic assistance is not required to transport the biological molecule through the mass spectrometry probe.

18. The method according to claim 11, wherein the paper is filter paper.

19. The method according to claim 18, wherein the filter paper comprises a pointed tip.

20. The method according to claim 18, wherein the filter paper does not comprise a point